US012690304B2

(12) United States Patent
Tang et al.

(10) Patent No.: US 12,690,304 B2
(45) Date of Patent: Jul. 21, 2026

(54) LIGHT-EMITTING SUBSTRATE AND DISPLAY APPARATUS

(71) Applicants:HEFEI BOE OPTOELECTRONICS TECHNOLOGY CO., LTD., Hefei (CN); BOE TECHNOLOGY GROUP CO., LTD., Beijing (CN)

(72) Inventors: Hai Tang, Beijing (CN); Bing Zhang, Beijing (CN); Jianwei Qin, Beijing (CN); Liang Gao, Beijing (CN); Bo Han, Beijing (CN); Xiaolin Geng, Beijing (CN); Yutian Chu, Beijing (CN)

(73) Assignees: HEFEI BOE OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 673 days.

(21) Appl. No.: 17/921,456

(22) PCT Filed: Nov. 3, 2021

(86) PCT No.: PCT/CN2021/128451
§ 371 (c)(1),
(2) Date: Oct. 26, 2022

(87) PCT Pub. No.: WO2022/227469
PCT Pub. Date: Nov. 3, 2022

(65) Prior Publication Data
US 2024/0395976 A1      Nov. 28, 2024

(30) Foreign Application Priority Data

Apr. 30, 2021    (CN) .......................... 202110480386.0

(51) Int. Cl.
| | |
|---|---|
| *H10H 20/841* | (2025.01) |
| *H10H 20/819* | (2025.01) |
| *H10W 90/00* | (2026.01) |

(52) U.S. Cl.
CPC ........ *H10H 20/841* (2025.01); *H10H 20/819* (2025.01); *H10W 90/00* (2026.01)

(58) Field of Classification Search
None
See application file for complete search history.

(56) References Cited

U.S. PATENT DOCUMENTS

| | | | |
|---|---|---|---|
| 2004/0228111 A1 | 11/2004 | Kuo et al. | |
| 2006/0072299 A1 | 4/2006 | Lai | |

(Continued)

FOREIGN PATENT DOCUMENTS

| | | |
|---|---|---|
| CN | 109613758 A | 4/2019 |
| CN | 111627952 A | 9/2020 |

(Continued)

OTHER PUBLICATIONS

International Search Report and Written Opinion (w/ English translation) for corresponding PCT Application No. PCT/CN2023/092983, mailed Jul. 26, 2023, 20 pages.

(Continued)

*Primary Examiner* — Feifei Yeung Lopez
(74) *Attorney, Agent, or Firm* — Dority & Manning, P.A.

(57) ABSTRACT

A light-emitting substrate includes a substrate, a reflective layer, at least one first alignment mark disposed on the substrate, a plurality of support columns and a plurality of light-emitting devices. The reflective layer is disposed on the substrate, and the reflective layer has a plurality of openings and a plurality of installation openings. The plurality of openings include at least one first opening. A first alignment mark is exposed by a first opening. In at least one support (Continued)

column, an orthogonal projection of a support column on the substrate at least partially overlaps with an orthogonal projection of an opening on the substrate. The plurality of light-emitting devices are disposed on the substrate, and a light-emitting device is located in an installation opening in the reflective layer.

17 Claims, 18 Drawing Sheets

(56) References Cited

U.S. PATENT DOCUMENTS

| 2012/0120325 | A1 * | 5/2012 | Shimizu ............ G02F 1/133608 |
| | | | 348/790 |
| 2013/0314899 | A1 | 11/2013 | Ye et al. |
| 2018/0190672 | A1 | 7/2018 | Lee et al. |
| 2018/0231839 | A1 | 8/2018 | Shimizu |

FOREIGN PATENT DOCUMENTS

| CN | 211454174 | U | 9/2020 |
| CN | 211741791 | U | 10/2020 |
| CN | 111900184 | A | 11/2020 |
| CN | 211979372 | U | 11/2020 |
| CN | 113270437 | A | 8/2021 |
| CN | 215680685 | U | 1/2022 |
| CN | 114005850 | A | 2/2022 |
| CN | 215896398 | U | 2/2022 |
| CN | 217691209 | U | 10/2022 |
| KR | 20120075977 | A | 7/2012 |

OTHER PUBLICATIONS

PCT International Search Report (w/ English translation) and Written Opinion for corresponding PCT Application No. PCT/CN2021/128451, mailed Jan. 30, 2022, 8 pages.

* cited by examiner

M

131

( a )

( b )

131

132

( a )

1321

1321

( b )

LIGHT-EMITTING SUBSTRATE AND DISPLAY APPARATUS

CROSS-REFERENCE TO RELATED APPLICATIONS

This application is a national phase entry under 35 USC 371 of International Patent Application No. PCT/CN2021/128451, filed on Nov. 3, 2021, which claims priority to Chinese Patent Application No. 202110480386.0, filed on Apr. 30, 2021, which are incorporated herein by reference in their entirety.

TECHNICAL FIELD

The present disclosure relates to the field of display technologies, and in particular, to a light-emitting substrate and a display apparatus.

BACKGROUND

At present, manufacturing of a mini light-emitting diode (LED) light panel needs to adopt processes such as an automated optical inspection (AOI) process, a die bonding process, a reworking process and a bonding process.

In these processes, alignment marks are provided on a substrate of the mini LED light panel. A positional accuracy of a structure to be installed on the substrate is ensured by acquiring a picture of the alignment marks for alignment.

SUMMARY

In an aspect, a light-emitting substrate is provided. The light-emitting substrate includes a substrate, a reflective layer, at least one first alignment mark, a plurality of support columns and a plurality of light-emitting devices. The reflective layer is disposed on the substrate, and the reflective layer has a plurality of openings and a plurality of installation openings. The plurality of openings include at least one first opening. The at least one first alignment mark is disposed on the substrate. A first alignment mark in the at least one first alignment mark is exposed by a first opening in the at least one first opening. In at least one support column, an orthogonal projection of a support column on the substrate at least partially overlaps with an orthogonal projection of an opening in the plurality of openings on the substrate. The plurality of light-emitting devices are disposed on the substrate, and a light-emitting device in the plurality of light-emitting devices is located in an installation opening in the reflective layer.

In some embodiments, the light-emitting substrate further includes fixing layers disposed on the substrate; the plurality of support columns are fixedly connected to the substrate through the fixing layers.

In some embodiments, the plurality of support columns include at least one first support column, and/or at least one second support column. A first support column in the at least one first support column includes a pedestal disposed in the opening, and a first main body portion located on a side of the pedestal away from the substrate and connected to the pedestal. A second support column in the at least one second support column includes a second main body portion.

In some embodiments, an orthogonal projection of the first support column on the substrate covers an orthogonal projection of the opening on the substrate. A surface of the pedestal away from the first main body portion is a first bottom surface, a surface of the pedestal connected to the first main body portion is a first top surface, and a surface of the first main body portion connected to the pedestal is a second bottom surface. An orthogonal projection of the second bottom surface on the substrate covers an orthogonal projection of the first top surface on the substrate. A dimension of the pedestal in a thickness direction of the substrate is less than or equal to a dimension of the opening in the thickness direction of the substrate.

In some embodiments, the first bottom surface is located in a fixing layer in the fixing layers. In the thickness direction of the substrate, the first bottom surface is located between a surface of the reflective layer proximate to the substrate and a surface of the reflective layer away from the substrate. The second bottom surface is in contact with the surface of the reflective layer away from the substrate, and the orthogonal projection of the second bottom surface on the substrate covers the orthogonal projection of the opening on the substrate.

In some embodiments, the first main body portion includes a plurality of sections in a direction parallel to a plane where the substrate is located. In the plurality of sections, an area of at least one section is greater than or equal to an area of another section located on a side of the at least one section away from the substrate.

In some embodiments, in a direction directed from the pedestal to the first main body portion along the thickness direction of the substrate, areas of the plurality of sections of the first main body portion in the direction parallel to the plane where the substrate is located gradually decrease.

In some embodiments, an orthogonal projection of the pedestal on the substrate is in a shape of an annulus; or the pedestal is in a shape of a cylinder; or the pedestal includes a plurality of protrusions protruded from the second bottom surface to the substrate.

In some embodiments, a surface of the second support column proximate to the substrate is fixedly connected to the substrate through a fixing layer in the fixing layers.

In some embodiments, the surface of the second support column proximate to the substrate has at least one depression, at least a portion of the fixing layer is located in a depression in the second support column.

In some embodiments, an orthogonal projection of the depression on the substrate is in a shape of a circle or an annulus; or the orthogonal projection of the depression on the substrate includes a plurality of sectors arranged at intervals and in an annular.

In some embodiments, the second support column includes a plurality of sections in a direction parallel to the plane where the substrate is located. In the plurality of sections, an area of at least one section is greater than or equal to an area of another section located on a side of the at least one section away from the substrate.

In some embodiments, in a direction directed from the substrate to the second support column along a thickness direction of the substrate, areas of the plurality of sections of the second support column in the direction parallel to the plane where the substrate is located gradually decrease.

In some embodiments, a maximum distance between an outer boundary of an orthogonal projection, on the substrate, of a portion of the support column in the opening and a boundary of the orthogonal projection of the opening on the substrate is D1. An installation tolerance of the support column is A1; a radial dimension tolerance of the opening is A2; and a maximum allowable movement of the support column is A3. A sum of A1 and A2 is less than or equal to D1, and D1 is less than or equal to A3 (A1+A2≤D1≤A3).

In some embodiments, the light-emitting substrate has a middle region and an edge region located around the middle region, and the first opening is disposed in the edge region.

In some embodiments, no opening exists in the middle region, the plurality of support columns further include at least one second support column disposed in the middle region. A second support column in the at least one second support column is fixedly connected to a surface of the reflective layer away from the substrate through a fixing layer in the fixing layers.

In some embodiments, the plurality of openings further include at least one second opening, and no first alignment mark is exposed by a second opening in the at least one second opening. The second opening is disposed in the middle region.

In some embodiments, the at least one first opening includes a plurality of first openings, and at least one of the plurality of first openings is provided with a second alignment mark therein. The second alignment mark and the reflective layer are made of a same material and disposed in a same layer.

In some embodiments, in the plurality of first openings, a first opening provided with no second alignment mark is farther away from a center of the reflective layer than a first opening provided with the second alignment mark.

In some embodiments, the substrate includes a base, and a first conductive layer and/or a second conductive layer disposed on the base. The first alignment mark is disposed in a same layer as the first conductive layer and/or the second conductive layer.

In some embodiments, the plurality of light-emitting devices include a plurality of light-emitting device groups, and each light-emitting device group includes at least two light-emitting devices. The at least two light-emitting devices in a light-emitting device group are evenly arranged around a corresponding support column in the plurality of support columns, and a distance between each light-emitting device in the light-emitting device group and the corresponding support column is approximately equal.

In some embodiments, the light-emitting substrate has a plurality of light-emitting regions, and at least two light-emitting devices are disposed in a light-emitting region in the plurality of light-emitting regions. A support column that is close to an edge of the substrate and the edge of the substrate have at least two light-emitting regions therebetween.

In some embodiments, a color of the fixing layers is approximately same as a color of the reflective layer.

In some embodiments, the light-emitting substrate further includes a plurality of reflective sub-layers, and each reflective sub-layer includes a compensation portion and a raised portion.

The compensation portion of at least one reflective sub-layer in the plurality of reflective sub-layers is disposed on an inner wall of the opening, and the raised portion of the at least one reflective sub-layer is disposed at an edge of the opening; and/or, the compensation portion of at least one another reflective sub-layer in the plurality of reflective sub-layers is disposed on an inner wall of the installation opening, and the raised portion of the at least one another reflective sub-layer is disposed at an edge of the installation opening.

In another aspect, a display apparatus is provided. The display apparatus includes a display panel, the light-emitting substrate according to any one of the above embodiments and a plurality of optical films. The light-emitting substrate is disposed on a non-display side of the display panel, and the plurality of optical films are disposed between the light-emitting substrate and the display panel.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings.

In addition, the accompanying drawings to be described below may be regarded as schematic diagrams, but are not limitations on actual sizes of products, actual processes of methods, and actual timings of signals involved in the embodiments of the present disclosure.

DETAILED DESCRIPTION

Figure 1:
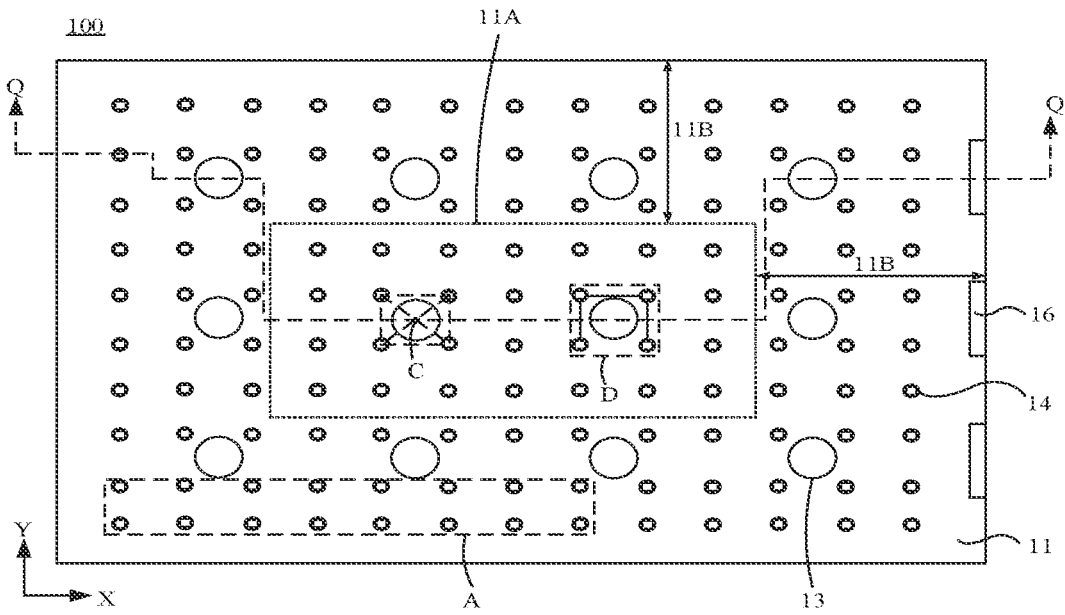
FIG. 1 is a top view of a light-emitting substrate, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the term such as "one embodiment," "some embodiments," "exemplary embodiments," "example," "specific example" or "some examples" is intended to indicate that specific features, structures, materials or characteristics related to the embodiment(s) or example(s) are included in at least one embodiment or example of the present disclosure. Schematic representation of the above term does not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the term "electrically connected" and derivatives thereof may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact.

The phrase "A and/or B" includes the following three combinations: only A, only B, and a combination of A and B.

The phrase "applicable to" or "configured to" used herein means an open and inclusive expression, which does not exclude devices that are applicable to or configured to perform additional tasks or steps.

In addition, the phrase "based on" used is meant to be open and inclusive, since a process, step, calculation or other action that is "based on" one or more of the stated conditions or values may, in practice, be based on additional conditions or values exceeding those stated.

As used herein, the term "substantially" includes a stated value and an average value within an acceptable range of deviation of a particular value. The acceptable range of deviation is determined by a person of ordinary skill in the art in view of measurement in question and errors associated with measurement of a particular quantity (i.e., the limitations of the measurement system).

Exemplary embodiments are described herein with reference to section views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

Figure 2A:
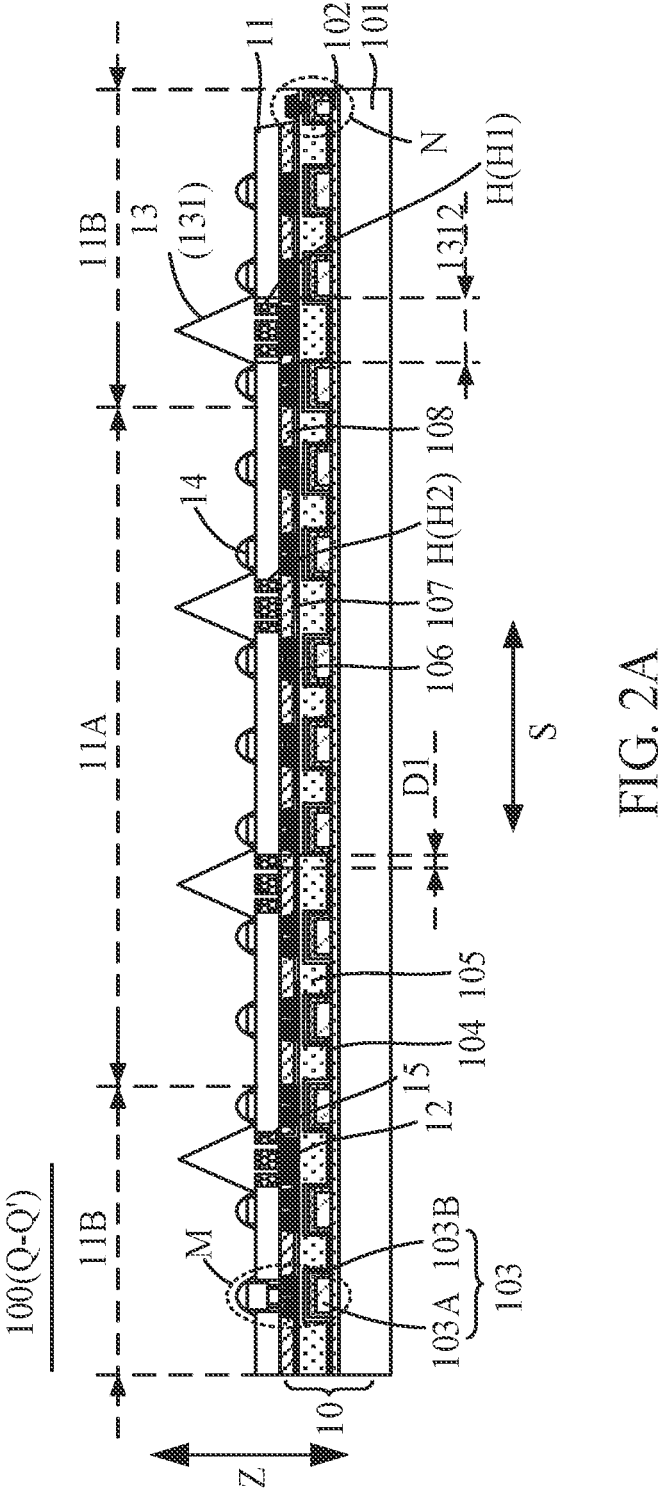
FIG. 2A is a section view of the light-emitting substrate in FIG. 1 taken along the line Q-Q'.

Some embodiments of the present disclosure provide a light-emitting substrate. As shown in FIGS. 1 and 2A, the light-emitting substrate 100 includes a substrate 10 and a reflective layer 11 disposed on the substrate 10.

At least part of a boundary of the reflective layer 11 coincides with at least part of a boundary of the substrate 10, and the reflective layer 11 has a plurality of openings H and a plurality of installation openings H3. The plurality of openings H include at least one first opening H1.

It will be noted that, FIGS. 1 and 2A show a case where part of the boundary of the reflective layer 11 coincides with part of the boundary of the substrate 10. The substrate 10 may have functional regions (e.g., regions 16 for bonding circuit board(s) shown in FIGS. 1 and 2C), in which no reflective layer 11 is provided.

For example, the reflective layer 11 is in a white color, so that the reflective layer 11 has a relatively high reflectivity.

For example, an orthogonal projection of the opening H on the substrate 10 may be in a shape of a circle, a triangle, or a rectangle.

As shown in FIG. 2A, the light-emitting substrate 100 further includes at least one first alignment mark 12 disposed on the substrate 10. A first alignment mark 12 is exposed by the first opening H1.

The first alignment mark 12 may be disposed at any position corresponding to the first opening H1. For example, the first alignment mark 12 may be disposed at a position corresponding to a center of the first opening H1, or may be disposed at a position corresponding to any position of the first opening H1 other than the center of the first opening H1.

The first opening H1 exposes the first alignment mark 12, so as to facilitate acquisition of a picture of the first alignment mark 12 for alignment.

It will be noted that, as shown in FIG. 2A, the substrate 10 includes a base 101 and a driving circuit disposed on the base 101. The driving circuit includes a plurality of thin film transistors and a plurality of signal lines. The first alignment mark 12 and any one conductive pattern of the driving circuit may be made of a same material and disposed in a same layer. For example, the first alignment mark 12 and a signal line of the driving circuit are made of the same material and disposed in the same layer. The signal line has a hollow region that penetrates the signal line along a thickness direction Z of the substrate 10, the first alignment mark 12 is disposed in the hollow region, and the first alignment mark 12 is insulated from the signal line.

Alternatively, any one conductive pattern of the driving circuit is of a laminated structure, and the first alignment mark 12 is also of the same laminated structure.

The "same layer" refers to a layer structure that is formed by forming a film layer for forming specific patterns by using a same film forming process, and then performing a single patterning process by using a same mask. Depending on different specific patterns, the signal patterning process may include multiple exposure, development or etching processes, and the specific patterns in the formed layer structure may be continuous or discontinuous, and these specific patterns may also be at different heights or have different thicknesses.

As shown in FIG. 2A, the light-emitting substrate 100 further includes a plurality of support columns 13. In at least one support column 13, an orthogonal projection of a support column 13 on the substrate 10 at least partially overlaps with an orthogonal projection of an opening H on the substrate 10.

It will be noted that a color of the support column 13 may be selected according to needs. For example, the support column 13 may be in the white color, so that a reflectivity of the support column 13 approaches the reflectivity of the reflective layer 11. As another example, the support column 13 may be transparent.

It can be understood that, a display apparatus includes a plurality of optical films disposed between a display panel and the light-emitting substrate 100. The plurality of support columns 13 are used for supporting the plurality of optical films, so that an optical distance exists between the reflective layer 11 of the light-emitting substrate 100 and the optical films. As a result, it may ameliorate a light shadow generated by the light-emitting substrate 100 and may improve the display image quality of the display apparatus.

The orthogonal projection of the support column 13 on the substrate 10 may completely or partially overlap with the orthogonal projection of the opening H on the substrate 10. For example, the orthogonal projection of the opening H on the substrate 10 is within the orthogonal projection of the support column 13 on the substrate 10.

Different structural designs of the support column 13 depend on different installation manners of the support column 13, and a structure of the support column 13 will be described in the content below in combination with the installation manner of the support column 13.

Figure 2B:
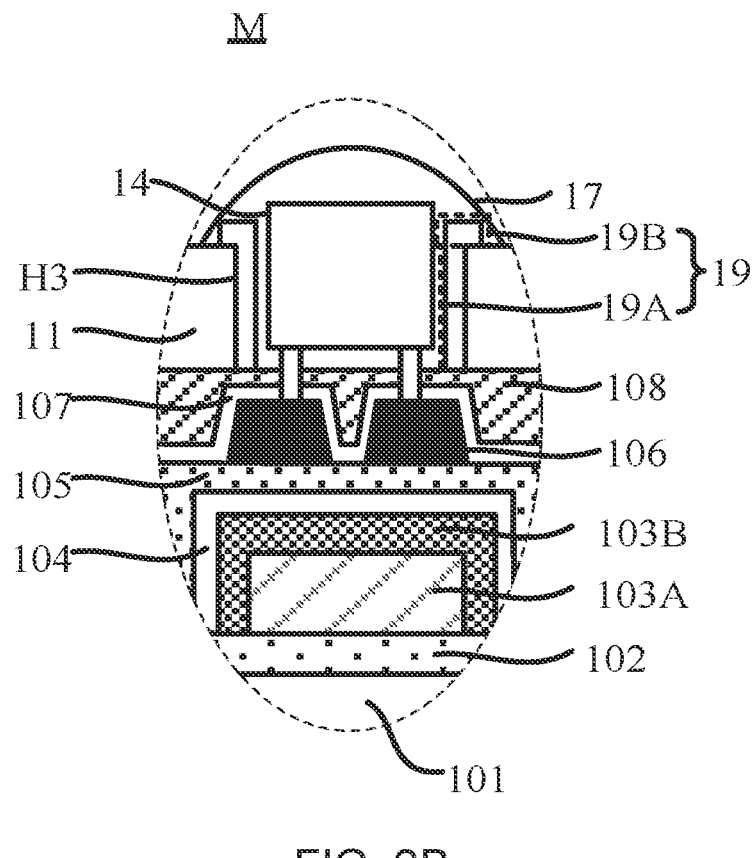
FIG. 2B is a partial enlarged view of the region M in FIG. 2A.
Figure 2C:
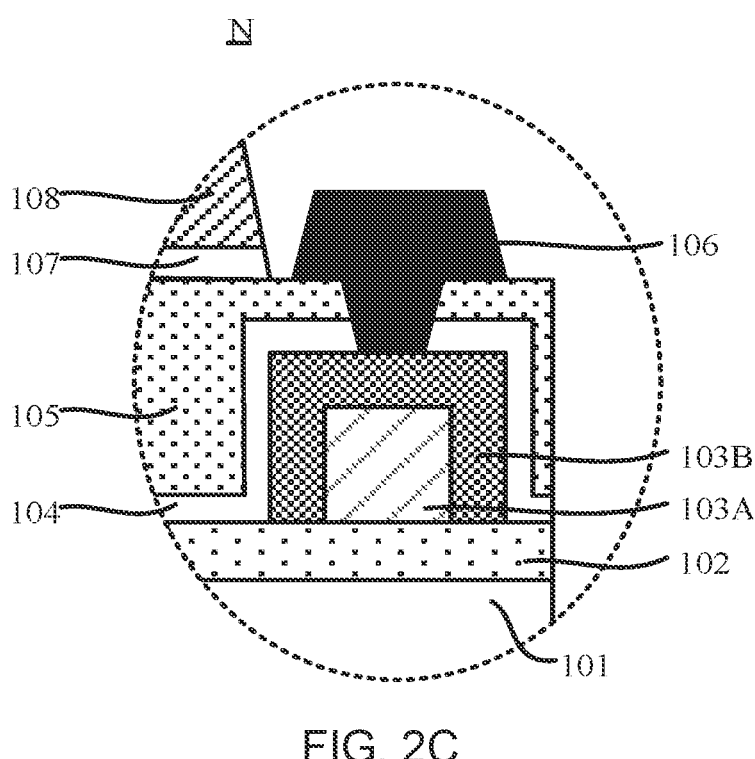
FIG. 2C is a partial enlarged view of the region N in FIG. 2A.

As shown in FIGS. 2A and 2B, the light-emitting substrate 100 further includes a plurality of light-emitting devices 14 disposed on the substrate 10. The light-emitting device 14 is located in an installation opening H3 in the reflective layer 11. The reflective layer 11 reflects light emitted by the light-emitting devices 14, so as to increase an amount of light exiting from the light-emitting substrate 100 in the direction Z perpendicular to a plane where the substrate 10 is located, and thus improve a light extraction efficiency of the light-emitting substrate 100.

It can be understood that, in a section view of the light-emitting substrate 100 taken along the line Q-Q' as shown in FIG. 2A, the number of light-emitting devices 14 is the same as the number of light-emitting devices 14 arranged in each row along the direction X in FIG. 1.

It will be noted that, the light-emitting device 14 may be electrically connected to the driving circuit of the substrate 10 through the installation opening H3 in the reflective layer 11, so as to be driven to emit light by the driving circuit. Alternatively, the light-emitting device 14 may be electrically connected to a signal line in the substrate 10 through the installation opening H3 in the reflective layer 11. The signal line is electrically connected to a driver integrated circuit (IC), and used for transmitting a voltage signal or a current signal from the driver IC to the light-emitting device 14 to drive the light-emitting device 14 to emit light.

In the related art, an alignment mark of a light-emitting substrate is provided in an edge region of the substrate, which increases an edge area of the substrate and causes a bezel of a display apparatus installed with the light-emitting substrate to be relatively wide. As a result, it is not conducive to a narrow-bezel design of the display apparatus. In a case where the edge region of the substrate in which the alignment mark is provided is cut off through a cutting process after alignment is completed, a cost is increased due to the additional cutting process.

In light of this, in the light-emitting substrate 100 in the embodiments of the present disclosure, the first alignment mark 12 is exposed by the first opening H1 in the reflective layer 11, so that there is no need for the substrate 10 to be provided with the edge region. Thus, the at least part of the boundary of the reflective layer 11 overlaps with the at least part of the boundary of the substrate 10, which is conducive to the narrow-bezel design of the display apparatus. In addition, the substrate 10 is not provided with the edge region, which does not increase the cost for cutting the edge region.

In some embodiments, as shown in FIG. 2A, the substrate 10 includes the base 101, a first conductive layer 103 and/or a second conductive layer 106 disposed on the base 101.

The first alignment mark 12 is disposed in a same layer as the first conductive layer 103 and/or the second conductive layer 106.

For example, the substrate 10 includes the base 101 and the first conductive layer 103 disposed on the base 101. The first alignment mark 12 is disposed in the same layer as the first conductive layer 103.

For example, the substrate 10 includes the base 101 and the second conductive layer 106 disposed on the base 101. The first alignment mark 12 is disposed in the same layer as the second conductive layer 106.

For example, as shown in FIG. 2A, the substrate 10 includes the base 101, and a buffer layer 102, the first conductive layer 103, a first passivation layer 104, a first planarization layer 105, the second conductive layer 106, a second passivation layer 107 and a second planarization layer 108 that are stacked on the base 101 in sequence. The first conductive layer 103 and the second conductive layer 106 are used to form conductive patterns of the driving circuit. The first alignment mark 12 may be formed together with the first conductive layer 103 or the second conductive layer 106, or may be formed together with both the first conductive layer 103 and the second conductive layer 106.

For example, the first alignment mark 12 may be formed together with the second conductive layer 106, so as to reduce a distance between the first alignment mark 12 and a surface of the substrate 10 proximate to the reflective layer 11. As a result, the picture of the first alignment mark 12 acquired from the surface of the substrate 10 is relatively clear, which is beneficial to improve an alignment accuracy.

In some embodiments, as shown in FIG. 2A, the base 101 of the substrate 10 may be a printed circuit board (PCB) or a glass base. For example, a thickness of the base 101 may be in a range of 0.4 mm to 3 mm, inclusive. For example, the thickness of the base 101 may be 0.4 mm, 1 mm, 1.5 mm, 2 mm or 3 mm.

In some embodiments, a fabricating process of the first conductive layer 103 may include a magnetron sputtering process. As shown in FIGS. 2A and 2B, the first conductive layer 103 fabricated by the magnetron sputtering process includes a first conductive sub-layer 103A and a second conductive sub-layer 103B.

The first conductive sub-layer 103A may include copper. The second conductive sub-layer 103B may include a molybdenum-niobium (MoNb) alloy, copper and a MoNb alloy that are stacked in sequence. The MoNb alloy close to the base 101 plays a role of adhesion, and the MoNb alloy far away from the base 101 plays a role of an antioxidant effect.

For example, a thickness of the MoNb alloy, close to the base 101, of the second conductive sub-layer 103B may be in a range of 290 Å to 310 Å, inclusive. For example, the thickness of the MoNb alloy, close to the base 101, of the second conductive sub-layer 103B may be 290 Å, 296 Å, 300 Å, 305 Å or 310 Å. A thickness of the MoNb alloy, far away from the base 101, of the second conductive sub-layer 103B may be in a range of 190 Å to 210 Å, inclusive. For example, the thickness of the MoNb alloy, far away from the base 101, of the second conductive sub-layer 103B may be 190 Å, 195 Å, 200 Å, 206 Å or 210 Å.

In some embodiments, the fabricating process of the first conductive layer 103 may also include an electroplating process. The first conductive layer 103 fabricated by the electroplating process may include a first molybdenum-nickel-titanium (MoNiTi) alloy, copper and a second MoNiTi alloy that are stacked in sequence. The first MoNiTi alloy may improve a nucleation density of crystal grains, and the second MoNiTi alloy may have an antioxidant effect.

For example, a thickness of the first MoNiTi alloy of the first conductive layer 103 may be in a range of 290 Å to 310 Å, inclusive. For example, the thickness of the first MoNiTi alloy of the first conductive layer 103 may be 290 Å, 296 Å, 300 Å, 305 Å or 310 Å. A thickness of the second MoNiTi alloy of the first conductive layer 103 may be in a range of 190 Å to 210 Å, inclusive. For example, the thickness of the second MoNiTi alloy of the first conductive layer 103 may be 190 Å, 195 Å, 200 Å, 206 Å or 210 Å.

In some embodiments, a thickness of the first conductive layer 103 may be in a range of 1.5 μm to 7 μm, inclusive. For example, the thickness of the first conductive layer 103 may be 1.5 μm, 2 μm, 4 μm, 6.5 μm or 7 μm.

In some embodiments, as shown in FIGS. 2A and 2B, the second conductive layer 106 may include a MoNb alloy, copper and a protective layer that are stacked in sequence. The protective layer may include any one of a copper-nickel alloy (CuNi), nickel or indium tin oxide (ITO). The MoNb alloy plays a role of adhesion, and the protective layer has an antioxidant effect and ensures firmness of die bonding.

For example, a thickness of the second conductive layer 106 may be in a range of 5500 Å to 6500 Å, inclusive. For example, the thickness of the second conductive layer 106 may be 5500 Å, 5800 Å, 6000 Å, 6200 Å or 6500 Å.

In some embodiments, the reflective layer 11 may be a reflective sheet, e.g., a white reflective sheet. Alternatively, the reflective layer 11 may also be a reflective coating layer.

Alternatively, a material of the reflective layer 11 may include white oil, and the white oil may include resin (e.g., epoxy resin, or polytetrafluoroethylene resin), titanium dioxide ($TiO_2$) and an organic solvent (e.g., dipropylene glycol methyl ether). The material of the reflective layer 11 may also include a silicone-based white adhesive. In a case where the material of the reflective layer 11 includes the white oil or the silicone-based white adhesive, a screen printing process may be used to print the white oil or the silicone-based white adhesive to form the reflective layer 11. For example, a thickness of the reflective layer 11 may be in a range of 10 μm to 300 μm, inclusive. For example, the thickness of the reflective layer 11 may be 10 μm, 50 μm, 80 μm, 155 μm, 200 μm or 300 μm. For example, the reflective layer 11 may be formed by one or more screen printing processes. In a case where the reflective layer 11 is fabricated by multiple screen printing processes, sizes of openings may be different, so as to improve a fabricating accuracy of the reflective layer near an opening region. In this way, an edge of the opening region of the reflective layer 11 has a stepped shape.

In some embodiments, as shown in FIG. 2B, the light-emitting substrate 100 further includes a plurality of reflective sub-layer 19. The reflective sub-layer 19 includes a compensation portion 19A and a raised portion 19B. The compensation portion 19A of at least one reflective sub-layer 19 is disposed on an inner wall of an installation opening H3, and the raised portion 19B of the at least one reflective sub-layer 19 is disposed at an edge the installation opening H3.

For example, the compensation portion 19A is disposed around the inner wall of the installation opening H3, and the raised portion 19B is disposed around the edge of the installation opening H3.

By providing the compensation portion 19A of the reflective sub-layer 19, it may be possible to compensate for a radial dimension of the installation opening H3, and improve a dimensional accuracy of the installation opening H3.

In some embodiments, the compensation portion 19A of at least one reflective sub-layer 19 is disposed on an inner wall of an opening H, and the raised portion 19B of the at least one reflective sub-layer 19 is disposed at an edge of the opening H.

For example, the compensation portion 19A is disposed around the inner wall of the opening H, and the raised portion 19B is disposed around the edge of the opening H.

By providing the compensation portion 19A of the reflective sub-layer 19, it may be possible to compensate for a radial dimension of the opening H, and improve a dimensional accuracy of the opening H.

In some embodiments, a thickness of the reflective sub-layer 19 in a thickness direction of the substrate 10 is greater than the thickness of the reflective layer 11. For example, the thickness of the reflective sub-layer 19 may be in a range of 40 μm to 330 μm, inclusive. For example, the thickness of the reflective sub-layer 19 may be 40 μm, 50 μm, 80 μm, 185 μm, 200 μm or 330 μm.

It will be noted that, the reflective sub-layer 19 is fabricated by a glue filling process (i.e., spraying glue with an injection valve), which is different from the screen printing process for fabricating the reflective layer 11. By spraying the glue around the edge of the opening H and/or the edge of the installation opening H3, the thickness of the reflective sub-layer 19 can be greater than the thickness of the reflective layer 11.

In some embodiments, a material of the reflective sub-layer 19 includes a silicone-based white adhesive, and the silicone-based white adhesive is in the white color. As a result, the reflective sub-layer 19 has an approximately same color as the reflective layer 11, so as to ensure a light reflectivity of the reflective sub-layer 19, and make the light reflectivity of the reflective sub-layer 19 approach the light reflectivity of the reflective layer 11.

In some embodiments, as shown in FIG. 2B, the light-emitting substrate 100 further includes an encapsulation layer 17 disposed on a side of the light-emitting devices 14 away from the substrate 10. The encapsulation layer 17 is used for protecting the light-emitting devices 14.

For example, the encapsulation layer 17 may cover the light-emitting devices 14 as a whole layer.

For example, as shown in FIG. 2B, the encapsulation layer 17 may include a plurality of encapsulation sub-layers, and each encapsulation sub-layer wraps a light-emitting device 14.

In some embodiments, the orthogonal projection of the support column 13 on the substrate 10 does not overlap with the second conductive layer 106 of the substrate 10. For example, a minimum distance between a boundary of the orthogonal projection of the support column 13 on the substrate 10 and a contour boundary of the second conductive layer 106 is greater than or equal to 3 mm, which may reduce a pressure of the support column 13 on the second conductive layer 106 and prevent the second conductive layer 106 from being damaged due to the pressure.

In some embodiments, as shown in FIG. 2A, the substrate 10 is provided with fixing layers 15 thereon, and the support columns 13 are fixedly connected to the substrate 10 through the fixing layers 15.

For example, a material of the fixing layer 15 may include glue, and the fixing layer 15 is formed after the glue is cured.

In some embodiments, the material of the fixing layer 15 may include a reactive hot melt adhesive, such as polyure-thane resin (PUR). The reactive hot melt adhesive has a property of high temperature resistance and may ensure a stability of the fixing layer 15 under a high temperature.

It will be noted that, an adhesive strength and viscosity of the glue required for fabricating the fixing layer 15 may be adjusted according to needs, so as to ensure a bonding strength between the support column 13 and the fixing layer 15.

In addition, the fixing layer 15 may be in the white color, colorless and transparent, or in a faint yellow color. By making the fixing layer 15 in the white color, the fixing layer 15 has an approximate same color as the reflective layer 11, so as to ensure a light reflectivity of the fixing layer 15 and make the light reflectivity of the fixing layer 15 approach the light reflectivity of the reflective layer 11.

In some other embodiments, a fixed connection manner of the support column 13 and the substrate 10 may also be welding or clamping.

As mentioned above, the structure of the support column 13 is related to the installation manner thereof, and the support column 13 will be described in some embodiments of the present disclosure in detail below.

In some embodiments, as shown in FIG. 2A, the plurality of support columns 13 include at least one first support column 131. At least a portion of the first support column 131 is disposed in the opening H, so that the first support column 131 is installed in the opening H. In a case where the glue used for bonding the first support column 131 is not cured, the opening H may be used to limit a movement of the first support column 131 along a direction S parallel to the plane where the substrate 10 is located. As a result, the first support column 131 is avoided from falling off, so as to ensure surface flatness of the optical film and thus ensure an optical performance of the optical film.

It will be noted that "the plane where the substrate is located" refers to a surface of the substrate 10 on a light-exit side of the light-emitting substrate 100.

In some embodiments, as shown in FIG. 2A, an orthogonal projection of the first support column 131 on the substrate 10 covers an orthogonal projection of the corresponding opening H on the substrate 10, so that the first support column 131 may block the opening H. As a result, it may avoid affecting the light extraction efficiency of the light-emitting substrate 100 as a whole and a display effect of the display apparatus due to an exposure of the opening H in the reflective layer 11.

It will be noted that, a material of the first support column 131 may include a reflective material, and a light reflectivity of the first support column 131 is approximately equal to the light reflectivity of the reflective layer 11. The first support column 131 blocks the opening H, which may avoid a reduction in a reflection area of the reflective layer 11 due to the arrangement of the opening H in the reflective layer 11. As a result, it avoids affecting the light extraction efficiency of the light-emitting substrate 100 as the whole and the display effect of the display apparatus.

For example, as shown in FIG. 2A, a portion of the first support column 131 close to the substrate 10 (i.e., a bottom of the first support column 131) is disposed in the opening H, and the orthogonal projection of the first support column 131 on the substrate 10 covers the orthogonal projection of the corresponding opening H on the substrate 10, so that the first support column 131 may block the opening H.

The structure of the first support column 131 will be described in detail hereinafter.

Figure 5A:
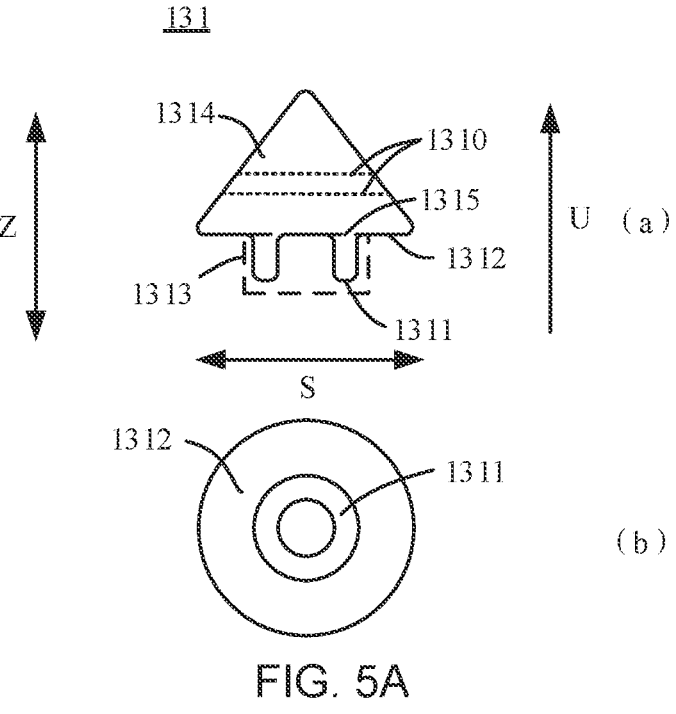
FIG. 5A is a structural diagram of a first support column, in accordance with some embodiments of the present disclosure.

In some embodiments, referring to FIGS. 2A and 5A, the first support column 131 includes a pedestal 1313 disposed in the opening H, and a first main body portion 1314 located on a side of the pedestal 1313 away from the substrate 10 and connected to the pedestal 1313.

By installing the pedestal 1313 of the first support column 131 in the opening H, it may be possible to limit the movement of the first support column 131 along the direction S parallel to the plane where the substrate 10 is located, and ensure distribution uniformity of the first support columns 131 in the direction S, so that differences of deformation amounts, at different regions, of the optical film supported by the first support columns 131 are reduced, and the surface flatness of the optical film is improved. As a result, the optical performance of the optical film is ensured. The first main body portion 1314 of the first support column 131 is used to support the optical film, so as to reduce the deformation amount of the optical film caused by stress on the optical film.

Referring to FIGS. 2A and 5A, a surface of the pedestal 1313 away from the first main body portion 1314 is a first bottom surface 1311, and a surface of the pedestal 1313 connected to the first main body portion 1314 is a first top surface 1315. A surface of the first main body portion 1314 connected to the pedestal 1313 is a second bottom surface 1312. An orthogonal projection of the second bottom surface 1312 on the substrate 10 covers an orthogonal projection of the first top surface 1315 on the substrate 10, so that an overhanging surface is formed between the pedestal 1313 and the first main body portion 1314. A dimension of the pedestal 1313 in the thickness direction Z of the substrate 10 is less than or approximately equal to a dimension of the opening H in the thickness direction Z of the substrate 10.

In some embodiments, as shown in FIGS. 2A and 5A, the dimension of the pedestal 1313 in the thickness direction Z of the substrate 10 is approximately equal to the dimension of the opening H in the thickness direction Z of the substrate 10, so as to ensure that the first bottom surface 1311 of the pedestal 1313 is in contact with a surface of the second planarization layer 108 of the substrate 10, and the second bottom surface 1312 of the first main body portion 1314 may be in contact with a surface of the reflective layer 11.

In some embodiments, referring to FIGS. 2A and 5A, the first bottom surface 1311 is located in the fixing layer 15. In the thickness direction Z of the substrate 10, the first bottom surface 1311 is located between a surface of the reflective layer 11 proximate to the substrate 10 and a surface of the reflective layer 11 away from the substrate 10. The second bottom surface 1312 is in contact with the surface of the reflective layer 11 away from the substrate 10.

It will be noted that, referring to FIGS. 2A and 5A, the first bottom surface 1311 is in contact with the surface of the second planarization layer 108 of the substrate 10. In fact, a portion of the fixing layer 15 exists between the first bottom surface 1311 and the second planarization layer 108, but the portion of the fixing layer 15 may be negligible.

Since the first bottom surface 1311 and the second bottom surface 1312 are two parallel surfaces of the stepped structure formed between the pedestal 1313 and the first main body portion 1314, the first bottom surface 1311 is in contact with the surface of the second planarization layer 108 of the substrate 10, and the second bottom surface 1312 is in contact with the surface of the reflective layer 11, so as to limit the first support column 131 and ensure an installation height of the first support column 131. Thus, it may be possible to improve uniformity of installation heights of the first support columns 131, make supporting heights of the first support columns 131 to respective regions of the optical film be approximately the same, and make different regions of the optical film have an approximately same deformation amount. As a result, it helps improve the surface flatness of the optical film, so as to ensure the optical performance of the optical film.

As shown in FIG. 2A, the orthogonal projection of the second bottom surface 1312 of the first support column 131 on the substrate 10 covers the orthogonal projection of the corresponding opening H on the substrate 10, so that the second bottom surface 1312 of the first support column 131 may block the opening H. As a result, it may avoid the reduction in the reflection area of the reflective layer 11 due to the arrangement of the opening H in the reflective layer 11, so as to avoid affecting the light extraction efficiency of the light-emitting substrate 100 as the whole and the display effect of the display apparatus.

Figure 5B:
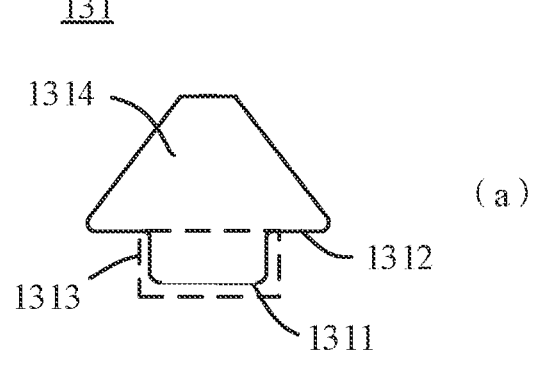
FIG. 5B is a structural diagram of another first support column, in accordance with some embodiments of the present disclosure.
Figure 5B:
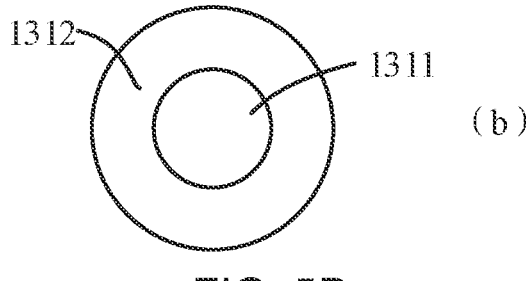

In some embodiments, as shown in FIGS. 5A and 5B, in a direction U directed from the pedestal 1313 to the first main body portion 1314 along the thickness direction Z of the substrate 10, areas of sections of the first main body portion 1314 in the direction S parallel to the plane where the substrate 10 is located gradually decrease.

With this arrangement, in a case where an area of the second bottom surface 1312 of the first main body portion 1314 remains unchanged, a volume of the first main body portion 1314 may be reduced, so as to reduce blocking of the first main body portion 1314 of the first support column 131 on light and increase an amount of light exiting from the light-emitting substrate 100 along the thickness direction Z of the substrate 10. As a result, the light extraction efficiency of the light-emitting substrate 100 is improved.

In some embodiments, as shown in FIG. 5A, the first main body portion 1314 of the first support column 131 includes a plurality of sections 1310 in the direction S parallel to the plane where the substrate 10 is located. An area of at least one section 1310 is greater than or equal to an area of another section 1310 located on a side of the section away from the substrate 10.

Figure 5C:
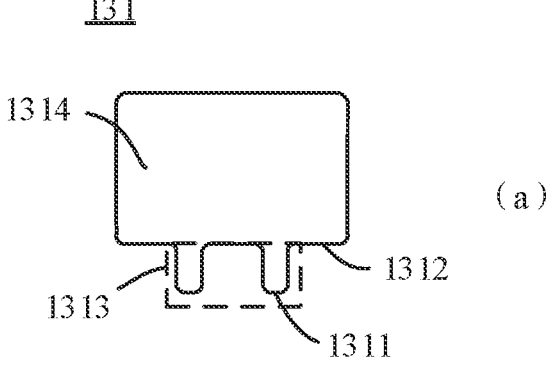
FIG. 5C is a structural diagram of yet another first support column, in accordance with some embodiments of the present disclosure.
Figure 5C:
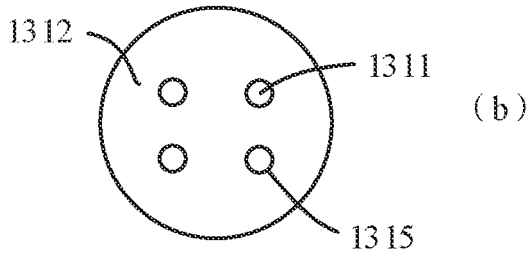

For example, as shown in FIG. 5A, the first main body portion 1314 of the first support column 131 may be in a shape of a cone. As shown in FIG. 5B, the first main body portion 1314 of the first support column 131 may be in a shape of a frustum of a cone. As shown in FIG. 5C, the first main body portion 1314 of the first support column 131 may be in the shape of a cylinder.

Figure 5D:
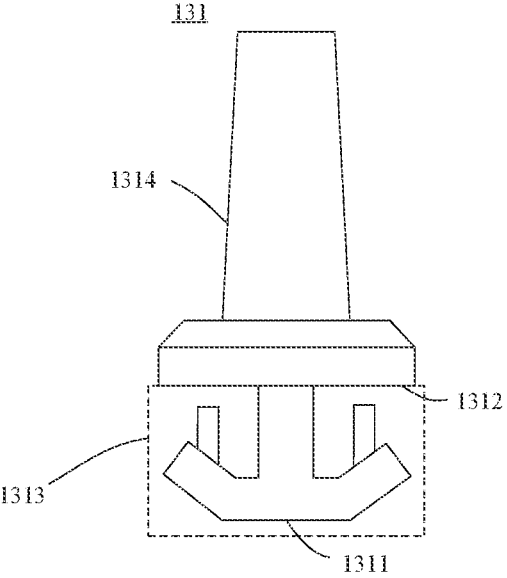
FIG. 5D is a structural diagram of yet another first support column, in accordance with some embodiments of the present disclosure.

In some embodiments, the first support column 131 is of the structure shown in FIG. 5D, the pedestal 1313 of the first support column 131 is a buckle, and the buckle includes a first bottom surface 1311 close to the substrate 10. The first main body portion 1314 of the first support column 131 includes a base body connected to the buckle, and a frustum of a cone connected to the base body and located on a side of the base body away from the buckle. The base body includes a second bottom surface 1312 connected to the buckle.

In the related art, the substrate of the light-emitting substrate is provided therein with a through hole. The pedestal 1313 of the first support column 131 shown in FIG. 5D passes through the through hole of the substrate and is stuck in the through hole in the substrate, so that the first support column 131 is fixed. However, it also results in the alignment mark having no way to be arranged in the opening corresponding to the first support column 131. In the embodiments of the present disclosure, there is no need to provide the through hole in the substrate 10. The first support column 131 shown in FIG. 5D may be fixedly connected to the substrate 10 through the fixing layer 15, and first alignment mark 12 may also be exposed by the first opening H1.

A fixed manner of the first support column 131 will be described in detail hereinafter.

In some embodiments, referring to FIGS. 2A and 5A, the fixing layer 15 is disposed in the opening H in the reflective layer 11, and at least a portion of the pedestal 1313 of the first support column 131 is embedded in the fixing layer 15 and connected to the fixing layer 15, so that the first support column 131 is fixed on the substrate 10 through the fixing layer 15.

For example, in a case where the fixing layer 15 is not cured, the pedestal 1313 of the first support column 131 is embedded in the fixing layer 15, so that part of glue overflows from the opening H, and the part of glue exists between the second bottom surface 1312 of the first support column 131 and the reflective layer 11. A thickness of the part of glue after being cured is relatively small, and may be in a range of 0 (excluding 0) to 10 μm, such as 2 μm, 5 μm, 6 μm, 8 μm, or 10 μm.

By arranging the pedestal 1313 of the first support column 131 sticking into the fixing layer 15, it may increase a bonding area between the first support column 131 and the fixing layer 15, and improve a bonding strength of the first support column 131 and the fixing layer 15. In addition, a bonding area between the pedestal 1313 of the first support column 131 and the fixing layer 15 may be increased, and the bonding strength of the first support column 131 and the fixing layer 15 may be further improved. For example, the first support column 131 shown in FIG. 5A is adopted, and the pedestal 1313 of the first support column 131 is of a hollow cylindrical structure, so that an interior of the pedestal 1313 may be further bonded to the fixing layer 15.

In some embodiments, as shown in FIG. 5A, an orthogonal projection of the pedestal 1313 of the first support column 131 on the substrate 10 may be in a shape of an annulus. That is, the pedestal 1313 is of the hollow cylindrical structure. As shown in FIG. 5B, the pedestal 1313 may be in a shape of a cylinder. Alternatively, as shown in FIG. 5C, the pedestal 1313 includes a plurality of protrusions 1315 protruded from the second bottom surface 1312 to the substrate 10.

The first support column 131 is described above, and a second support column 132 will be described hereinafter.

Figure 3:
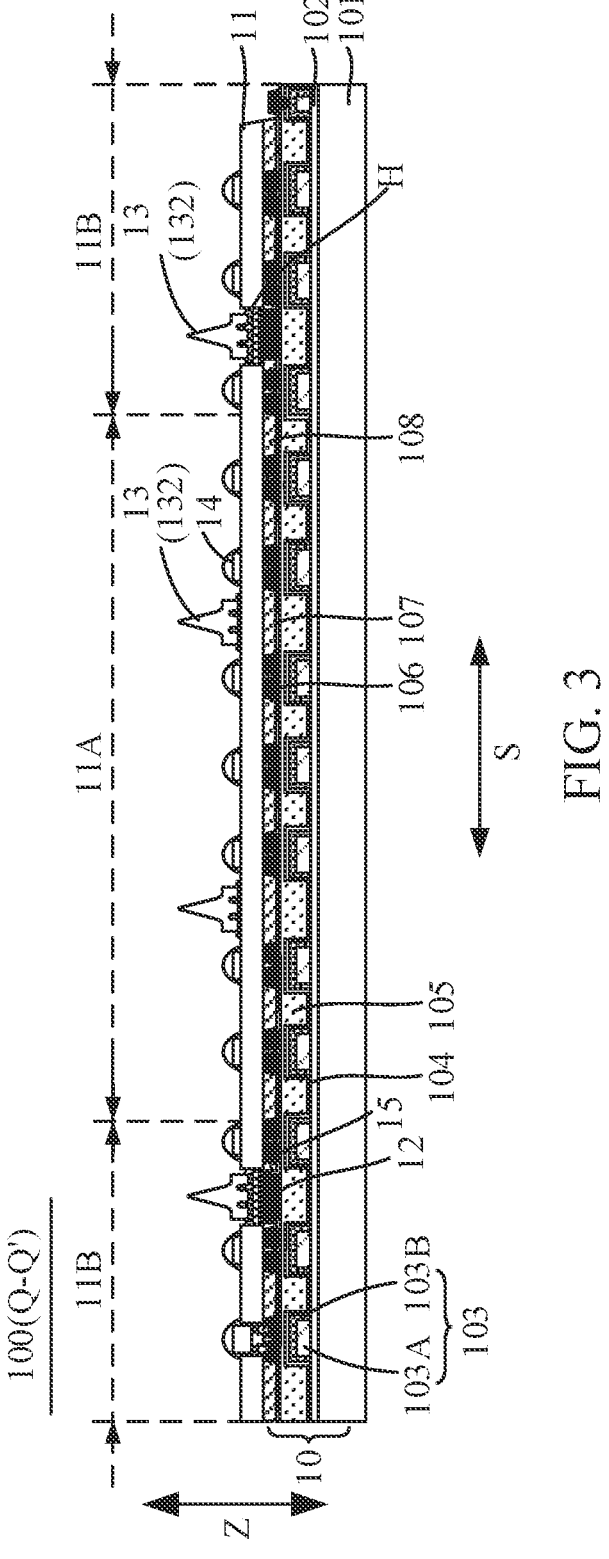
FIG. 3 is a structural diagram of another light-emitting substrate, in accordance with some embodiments of the present disclosure.
Figure 6A:
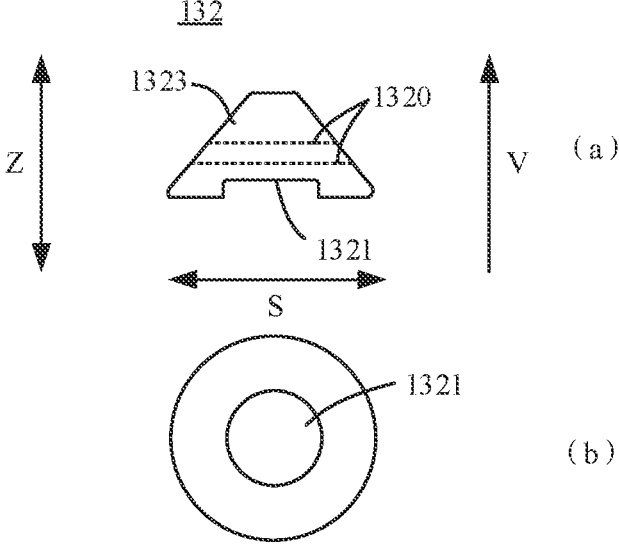
FIG. 6A is a structural diagram of a second support column, in accordance with some embodiments of the present disclosure.

In some embodiments, as shown in FIGS. 3 and 6A, the plurality of support columns 13 include at least one second support column 132. The second support column 132 includes a second main body portion 1323. It can be understood that, with respect to the first support column 131, the second support column 132 has no pedestal.

The orthogonal projection of the opening H on the substrate 10 covers an orthogonal projection of a corresponding second support column 132 on the substrate 10. In the thickness direction Z of the substrate 10, a surface of the second support column 132 proximate to the substrate 10 is located between the surface of the reflective layer 11 proximate to the substrate 10 and the surface of the reflective layer 11 away from the substrate 10. In a case where the glue used for bonding the second support column 132 is not cured, the opening H may be used to limit a movement of the second support column 132 along the direction S parallel to the plane where the substrate 10 is located. As a result, it prevents the second support column 132 from falling off, so as to ensure the surface flatness of the optical film and ensure the optical performance of the optical film.

For example, as shown in FIG. 3, a portion of a second support column 132 close to the substrate 10 (i.e., a bottom of the second support column 132) is fixedly disposed in the opening H.

Alternatively, as shown in FIG. 3, a second support column 132 is disposed on a side of the reflective layer 11 away from the substrate 10. That is, a region of the reflective layer 11 corresponding to the second support column 132 is not provided with an opening H. The second support column 132 may be directly disposed on the surface of the reflective layer 11 away from the substrate 10.

A material of the second support column 132 may include a reflective material, and a light reflectivity of the second support column 132 is approximately equal to the light reflectivity of the reflective layer 11, which may avoid a reduction in the reflection area of the reflective layer 11 due to the reflective layer 11 being blocked by the second support column 132. As a result, it avoids affecting the light extraction efficiency of the light-emitting substrate 100 as the whole and the display effect of the display apparatus.

In some other embodiments, the orthogonal projection of the second support column 132 on the substrate 10 may cover the orthogonal projection of the corresponding opening H on the substrate 10, and the second support column 132 is not disposed in the opening H.

Figure 6B:
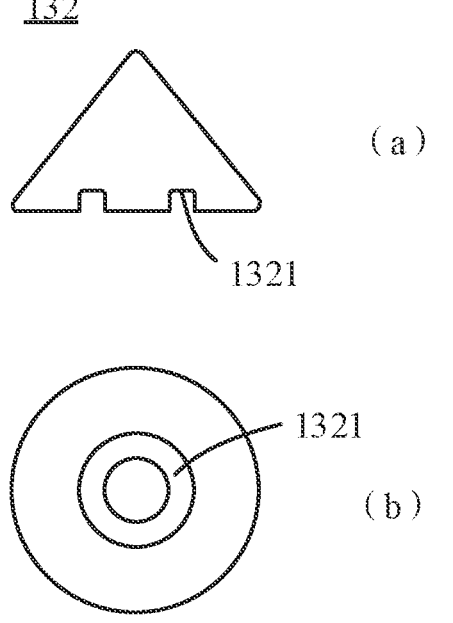
FIG. 6B is a structural diagram of another second support column, in accordance with some embodiments of the present disclosure.

In some embodiments, as shown in FIGS. 6A and 6B, in a direction V directed from the substrate 10 to the second support column 132 along the thickness direction Z of the substrate 10, areas of sections of the second support column 132 in the direction S parallel to the plane where the substrate 10 is located gradually decrease.

With this arrangement, in a case where an area of a bottom surface (a surface close to the substrate 10) of the second support column 132 remains unchanged, a volume of the second support column 132 may be reduced, so as to reduce blocking of the second support column 132 on the light and increase an amount of light exiting from the light-emitting substrate 100 along the thickness direction Z of the substrate 10. As a result, the light extraction efficiency of the light-emitting substrate 100 is improved.

Figure 7A:
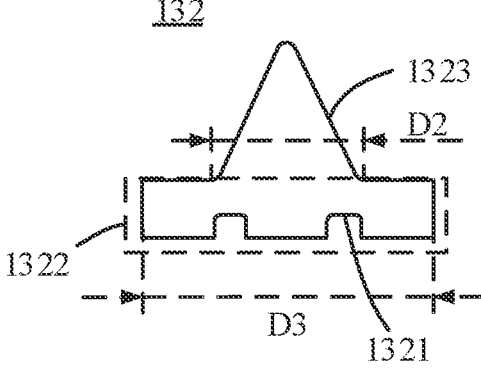
FIG. 7A is a structural diagram of yet another second support column, in accordance with some embodiments of the present disclosure.

For example, referring to FIGS. 3 and 7A, the second support column 132 includes a pedestal 1322 and a second main body portion 1323 located on a side of the pedestal 1322 away from the substrate 10 and connected to the pedestal 1322. A surface of the pedestal 1322 proximate to the substrate 10 has at least one depression 1321. A radial dimension D2 of an orthogonal projection, on the substrate 10, of a surface of the second main body portion 1323 proximate to the pedestal 1322 is less than a radial dimension D3 of an orthogonal projection, on the substrate 10, of a surface of the pedestal 1322 proximate to the second main body portion 1323.

For example, as shown in FIG. 7A, the radial dimension D2 of the orthogonal projection, on the substrate 10, of the surface of the second main body portion 1323 proximate to the pedestal 1322 is less than the radial dimension D3 of the orthogonal projection, on the substrate 10, of the surface of the pedestal 1322 proximate to the second main body portion 1323; the pedestal 1322 of the second support column 132 is in a shape of a cylinder, and the second main body 1323 of the second support column 132 is in a shape of a cone. It is equivalent to removing partial volumes of a cylinder on a basis of the cylinder to obtain the second support column 132 with a relatively small volume. As a result, the blocking of the second support column 132 on the light is reduced.

Figure 7B:
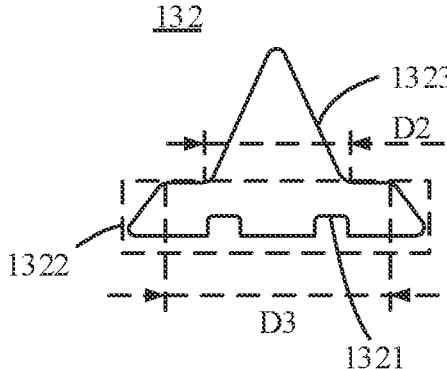
FIG. 7B is a structural diagram of yet another second support column, in accordance with some embodiments of the present disclosure.

For example, as shown in FIG. 7B, the radial dimension D2 of the orthogonal projection, on the substrate 10, of the surface of the second main body portion 1323 proximate to the pedestal 1322 is less than the radial dimension D3 of the orthogonal projection, on the substrate 10, of the surface of the pedestal 1322 proximate to the second main body portion 1323; the pedestal 1322 of the second support column 132 is in a shape of a frustum of a cone, and the second main body 1323 of the second support column 132 is in the shape of the cone. It is equivalent to removing partial volumes of a cone on a basis of the cone to obtain the second support column 132 with a relatively small volume. As a result, the blocking of the second support column 132 on the light is reduced.

In some embodiments, as shown in FIG. 6A, the second support column 132 includes a plurality of sections 1320 in the direction S parallel to the plane where the substrate 10 is located. An area of at least one section 1320 is greater than or equal to an area of another section 1320 located on a side of the section away from the substrate 10.

Figure 6C:
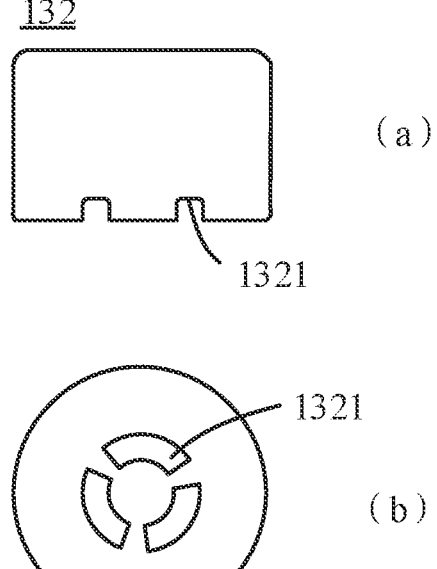
FIG. 6C is a structural diagram of yet another second support column, in accordance with some embodiments of the present disclosure.

For example, as shown in FIG. 6A, the second support column 132 may be in a shape of a frustum of a cone. As shown in FIG. 6B, the second support column 132 may be in a shape of a cone. As shown in FIG. 6C, the second support column 132 may be in a shape of a cylinder.

A fixed manner of the second support column 132 will be described in detail hereinafter.

In some embodiments, referring to FIGS. 3, 6A to 6C and 7A to 7B, the surface of the second support column 132 proximate to the substrate 10 is fixedly connected to the substrate 10 through a fixing layer 15.

For example, referring to FIG. 3 and FIG. 7A, the fixing layer 15 is disposed in the opening H in the reflective layer 11, and the surface of the second support column 132 proximate to the substrate 10 is fixedly connected to the substrate 10 through the fixing layer 15.

Alternatively, the second support column 132 is disposed on the side of the reflective layer 11 away from the substrate 10, the fixing layer 15 is disposed between the second support column 132 and the reflective layer 11, and the surface of the second support column 132 proximate to the substrate 10 is fixedly connected to the substrate 10 through the fixing layer 15. It will be noted that, a thickness of the fixing layer 15 should be set to be small. The thickness of the fixing layer 15 may be in a range of 30 μm to 100 μm, inclusive. For example, the thickness of the fixing layer 15 may be 30 μm, 40 μm, 65 μm, 80 μm or 100 μm. Therefore, it may ensure a bonding strength between the second support column 132 and the fixing layer 15.

In some embodiments, referring to FIG. 3 and FIG. 6A, the surface of the second support column 132 proximate to the substrate 10 has at least one depression 1321. At least a portion of the fixing layer 15 is located in the depression 1321 of the second support column 132, which may increase a bonding area between the second support column 132 and the fixing layer 15 and improve the bonding strength between the second support column 132 and the fixing layer 15.

For example, as shown in FIG. 6A, an orthogonal projection of the depression 1321 on the substrate 10 is in a shape of a circle. Alternatively, as shown in FIG. 6B, the orthogonal projection of the depression 1321 on the substrate 10 is in a shape of an annulus. Alternatively, as shown in FIG. 6C, the orthogonal projection of the depression 1321 on the substrate 10 includes a plurality of sectors arranged at intervals and in an annulus.

Figure 4:
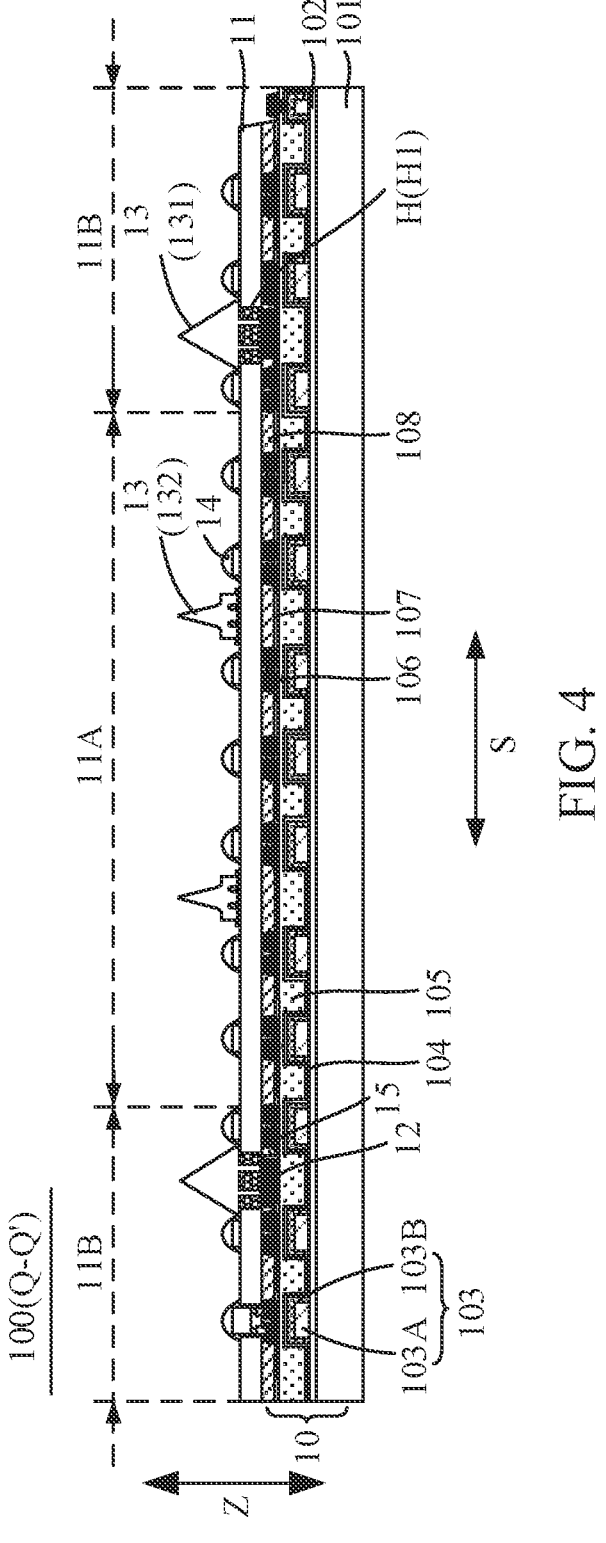
FIG. 4 is a structural diagram of yet another light-emitting substrate, in accordance with some embodiments of the present disclosure.

In some embodiments, as shown in FIG. 4, the plurality of support columns 13 include at least one first support column 131 and at least one second support column 132. At least a portion of the first support column 131 is disposed in the opening H, and the orthogonal projection of the first support column 131 on the substrate 10 covers the orthogonal projection of the corresponding opening H on the substrate 10, so that the first support column 131 is installed in the opening H and block the opening H.

As shown in FIG. 3, the orthogonal projection of the opening H on the substrate 10 covers the orthogonal projection of the corresponding second support column 132 on the substrate 10. In the thickness direction Z of the substrate 10, the surface of the second support column 132 proximate to the substrate 10 is located between the surface of the reflective layer 11 proximate to the substrate 10 and the surface of the reflective layer 11 away from the substrate 10. Alternatively, the second support column 132 is disposed on the side of the reflective layer 11 away from the substrate 10. That is, no opening H is provided in the region of the reflective layer 11 corresponding to the second support column 132, and the second support column 132 is directly disposed on the surface of the reflective layer 11.

In some embodiments, a maximum radial dimension of the first support column 131 and a maximum radial dimension of the second support column 132 each are in a range of 2 mm to 10 mm, such as 2 mm, 4 mm, 5 mm, 8 mm or 10 mm. A height of the first support column 131 and a height of the second support column 132 each are in a range of 1 mm to 12 mm, such as 1 mm, 4 mm, 6 mm, 8 mm or 12 mm.

In some embodiments, as shown in FIG. 2A, the installation of the support column 13 in the opening H meets the following requirements.

A maximum distance between an outer boundary of an orthogonal projection, on the substrate 10, of a portion of the support column 13 in the opening H and a boundary of the orthogonal projection of the opening H on the substrate 10 is D1. It can be understood that, in a case where the support column 13 may move in the opening H along the direction S parallel to the plane where the substrate 10 is located, a maximum distance that the support column 13 can move is D1.

An installation tolerance of the support column 13 is A1. That is, the installation tolerance of the support column 13 along the direction S parallel to the plane where the substrate 10 is located is A1.

A radial dimension tolerance of the opening H is A2, and a radial direction of the opening H is parallel to the plane where the substrate 10 is located.

A maximum allowable movement of the support column 13 (i.e., a maximum distance that the support column 13 is allowed to move in the opening H in the direction S parallel to the plane where the substrate 10 is located) is A3. It can be understood that, in a case where a distance that the support column 13 moves in the opening H along the direction S parallel to the plane where the substrate 10 is located is greater than the maximum allowable movement A3, the distribution of the support columns 13 in the direction S is uneven, and the surface flatness of the optical film cannot be ensured.

A sum of A1 and A2 is less than or equal to D1, and D1 is less than or equal to A3 (i.e., $A1+A2 \leq D1 \leq A3$). It can be understood that, D1 being greater than or equal to the sum of A1 and A2 (i.e., $D1 \geq A1+A2$) means that, the maximum distance D1 between the outer boundary of the orthogonal projection, on the substrate 10, of the portion of the support column 13 in the opening H and the boundary of the orthogonal projection of the opening H on the substrate 10 is greater than or equal to a sum of the installation tolerance A1 of the support column 13 and the radial dimension tolerance A2 of the opening H. Therefore, the support column 13 can be inserted into the opening H.

In addition, D1 being less than or equal to A3 (i.e., $D1 \leq A3$) means that, the maximum distance D1 between the outer boundary of the orthogonal projection, on the substrate 10, of the portion of the support column 13 in the opening H and the boundary of the orthogonal projection of the opening H on the substrate 10 is less than or equal to the maximum allowable movement A3 of the support column 13. Therefore, the maximum distance that the support column 13 can move in the opening H along the direction S parallel to the plane where the substrate 10 is located is less than or equal to the maximum allowable movement A3, which may ensure the uniformity of the distribution of the support columns 13 in the direction S, and thus ensure the surface flatness of the optical film and the optical performance of the optical film.

In some embodiments, as shown in FIGS. 1, 2A, 3 and 4, the light-emitting substrate 100 has a middle region 11A and an edge region 11B located around the middle region 11A.

For example, as shown in FIG. 4, the first support column 131 may be disposed in the opening H located in the edge region 11B, so that the pedestal 1313 of the first support column 131 is inserted into the fixing layer 15 in the opening H. The first support column 131 is bonded to the substrate 10 through the fixing layer 15. According to the above context, it may not only ensure the uniformity of the distribution of the first support columns 131 in the direction S, but also ensure the installation height of the first support column 131.

For example, as shown in FIG. 3, the second support column 132 may also be disposed in the opening H located in the edge region 11B, so that the pedestal 1322 of the second support column 132 is inserted into the fixing layer 15 in the opening H. At least a portion of the fixing layer 15 is located in the depression 1321 of the second support column 132, and the second support column 132 is bonded to the substrate 10 through the fixing layer 15.

It will be noted that, an optical distance (OD) exists between the light-emitting device 14 of the light-emitting substrate 100 and the optical films, which may ameliorate the light shadow generated by the light-emitting substrate 100 and improve the display image quality of the display apparatus 200. In a case where the optical distance is relatively large (for example, the optical distance is greater than or equal to 6 mm), the second support column 132 shown in FIG. 3 exposes partial regions of the opening H, which has a small influence on the light extraction efficiency of the light-emitting substrate 100 and the display effect of the display apparatus, and the influence may be ignored.

In some embodiments, as shown in FIGS. 3 and 4, no opening is provided in the middle region 11A, and second support column(s) 132 are disposed in the middle region 11A. The second support column 132 is fixedly connected to the surface of the reflective layer 11 away from the substrate 10 through the fixing layer 15.

For example, for the light-emitting substrate 100 shown in FIG. 3, no opening is provided in the middle region 11A, and there is no need to block the opening. The second support column 132 may be disposed on the side of the reflective layer 11 away from the substrate 10, and the fixing layer 15 is disposed between the second support column 132 and the reflective layer 11. At least a portion of the fixing layer 15 is embedded in the depression 1321 of the second support column 132, so that the second support column 132 is fixed on the reflective layer 11 through the fixing layer 15.

In some embodiments, as shown in FIG. 2A, the plurality of openings H of the reflective layer 11 further include at least one second opening H2. No first alignment mark 12 is exposed by the second opening H2, and the second opening H2 is disposed in the middle region 11A.

For example, for the light-emitting substrate 100 shown in FIG. 2A, the regions (the middle region 11A and the edge region 11B) of the light-emitting substrate 100 each are provided with opening(s) H, and all the openings H each are provided with a first support column 131 therein, which may ensure the uniformity of the installation height of each first support column 131.

With this arrangement, it may ensure that, in installation heights of the first support columns 131, a difference between a maximum value and a minimum value is in a range of 0 to 0.2 mm, inclusive. For example, the difference may be 0, 0.03 mm, 0.01 mm, and 0.18 mm, or 0.2 mm.

An arrangement of the first alignment mark 12 will be described hereinafter.

Figure 8A:
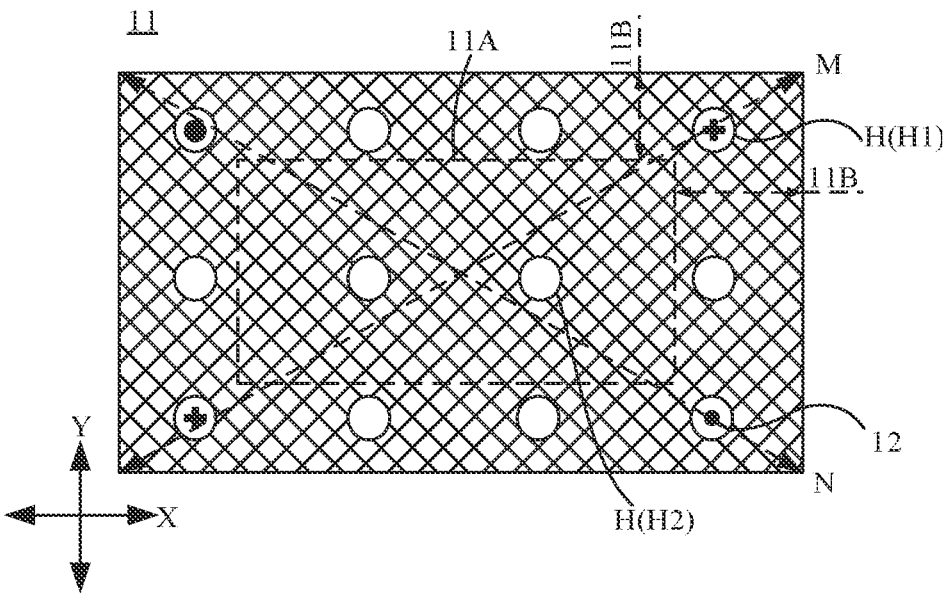
FIG. 8A is a structural diagram of a reflective layer, in accordance with some embodiments of the present disclosure.

In some embodiments, as shown in FIG. 8A, the first opening H1 is disposed in the edge region 11B, so that the first alignment mark 12 exposed by the first opening H1 is arranged in the edge region 11B. As a result, it helps acquire the picture of the alignment mark 12 for alignment.

For example, a distance between the alignment mark 12 and the boundary of the substrate 10 is in a range of 90 mm to 110 mm, inclusive. For example, the distance may be 90 mm, 96 mm, 100 mm, 105 mm or 110 mm.

Figure 8B:
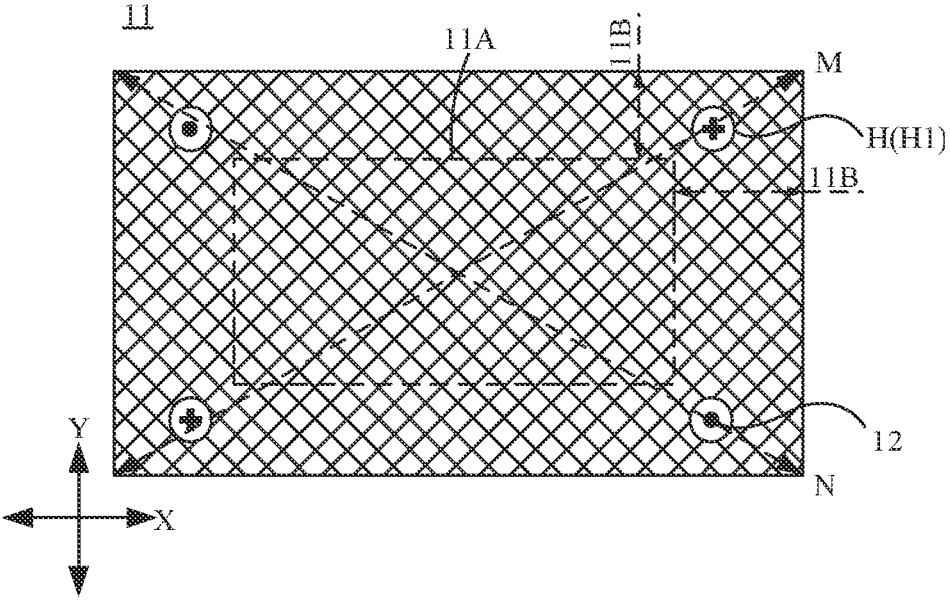
FIG. 8B is a structural diagram of another reflective layer, in accordance with some embodiments of the present disclosure.
Figure 8C:
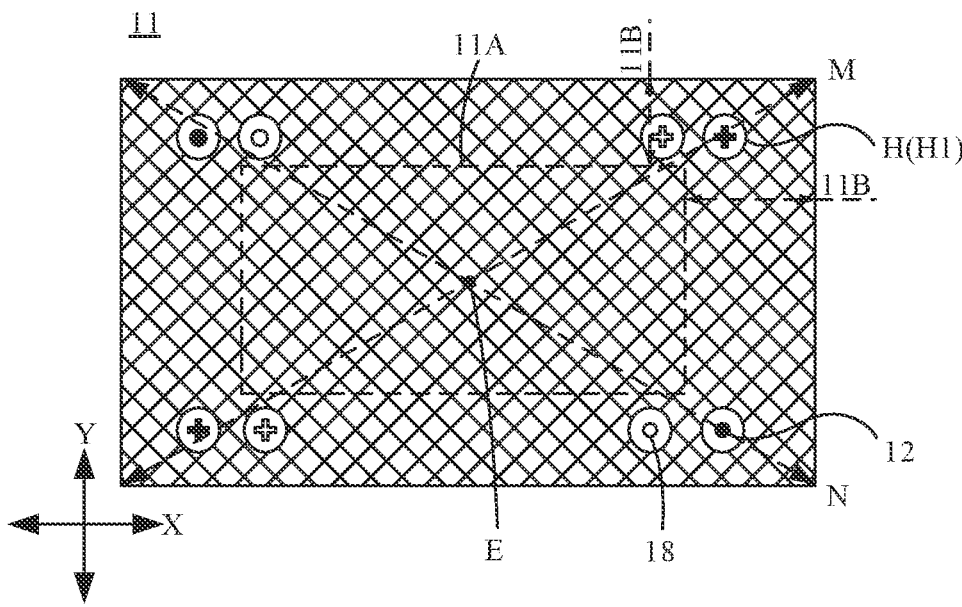
FIG. 8C is a structural diagram of yet another reflective layer, in accordance with some embodiments of the present disclosure.

In some embodiments, as shown in FIGS. 8B and 8C, the reflective layer 11 has a plurality of groups of first openings H1, and the plurality of groups of first openings H1 are evenly distributed in the edge region 11B. Each group of the first openings H1 includes at least one first opening H1.

For example, as shown in FIG. 8B, each group of the first openings H1 includes one first opening H1, so as to perform alignment through the first alignment mark 12 corresponding to each first opening H1.

For example, as shown in FIG. 8C, each group of the first openings H1 includes two first openings H1, and first alignment marks 12 exposed by different first openings H1 in a same group of first openings H1 are used for alignment in different processes.

In some embodiments, as shown in FIGS. 8A to 8C, the reflective layer 11 is in a quadrilateral shape having four corners. Along an extension direction (X direction or Y direction) of an edge of the reflective layer 11, first alignment marks 12 at two adjacent corners of the reflective layer 11 have different shapes. For example, a first alignment mark 12 at a corner in the two adjacent corners is in a circular shape, and a first alignment mark 12 at the other corner in the two adjacent corners is in a crossed shape. In a diagonal direction (M direction or N direction) of the reflective layer 11, first alignment marks 12 at two opposite corners of the reflective layer 11 are in a same shape. For example, the first alignment marks 12 at the two opposite corners are both in a circular shape or a crossed shape.

With the arrangements of the first alignment marks 12, the first alignment marks 12 at two adjacent corners of the reflective layer 11 may be easily distinguished during the alignment. As a result, it is easy to distinguish a position of the corner where each first alignment mark 12 is located, thereby ensuring an accuracy of an alignment position.

In some embodiments, the reflective layer 11 is in a quadrilateral shape, and first alignment marks 12 at four corners of the reflective layer 11 may also be arranged in a same shape. For example, the first alignment marks 12 may each be in the crossed shape, or circular shape. The first alignment marks 12 may also be designed in other ways. For example, first alignment marks 12 with the crossed shape are arranged at three corners in the four corners, and a first alignment mark 12 with the circular shape is arranged at the other corner in the four corners.

In some embodiments, as shown in FIG. 8C, at least one first opening H1 is provided with second alignment mark(s) 18 therein. The second alignment mark 18 and the reflective layer 11 are made of a same material and disposed in a same layer.

It will be noted that, the reflective layer 11 is fabricated on the substrate 10 through alignment of the first alignment mark 12, and in the same process, the second alignment mark 18 is fabricated. The second alignment mark 18 and the reflective layer 11 are made of the same material and disposed in the same layer. In addition, in the thickness direction Z of the substrate 10, the second alignment mark 18 and the first alignment mark 12 exposed by a same first opening H1 correspond.

In some embodiments, as shown in FIG. 8C, a first opening H1 provided with no second alignment mark 18 is farther away from a center E of the reflective layer 11 than a first opening H1 provided with the second alignment mark 18.

It can be understood that, the first alignment mark 12 exposed by the first opening H1 provided with the second alignment mark 18 is used for alignment during a process of fabricating the reflective layer 11. After the fabrication of the reflective layer 11, the second alignment mark 18 block the first alignment mark 12, so that the first alignment mark 12 exposed by the first opening H1 cannot be repeatedly used for alignment. Therefore, by arranging the first opening H1 provided with no second alignment mark 18 to be farther away from the center E of the reflective layer 11 than the first opening H1 provided with the second alignment mark 18, the first opening H1 provided with no second alignment mark 18 is closer to the boundary of the substrate 10. As a result, it helps the first alignment mark 12 exposed by the first opening H1 that is close to the boundary of the substrate 10 to be used for alignment in subsequent processes, and helps improve the alignment accuracy.

In some embodiments, as shown in FIG. 1, the plurality of light-emitting devices 14 include a plurality of light-emitting device groups D. Each light-emitting device group D includes at least two light-emitting devices 14, the at least two light-emitting devices 14 in each light-emitting device group D are evenly arranged around a support column 13, and a distance between each light-emitting device 14 in each light-emitting device group D and the support column 13 is approximately the same. As a result, it avoids an excessively short distance between the support column 13 and any one light-emitting device 14 to block light exit from the light-emitting device 14, and thus avoids uneven light exit from the light-emitting substrate 100.

It will be noted that, referring to FIG. 1, multiple light-emitting devices 14 are also arranged between two adjacent light-emitting device groups D, so that the light-emitting devices 14 on the light-emitting substrate 100 are evenly distributed. As a result, it ensures a uniformity of the light exit from the light-emitting substrate 100.

In addition, the light-emitting devices 14 in each light-emitting device group D may be connected in series, or may be connected in parallel, or may be connected in a combination of series and parallel. For example, as shown in FIG. 1, the light-emitting devices 14 in each light-emitting device group D are connected in series.

For example, as shown in FIG. 1, each light-emitting device group D includes four light-emitting devices 14, and the four light-emitting devices 14 are evenly arranged around the support column 13. For example, the support column 13 is located at a center C of a region enclosed by central connection lines of the four light-emitting devices 14, so that the distance between the support column 13 and each light-emitting device 14 is approximately the same. As a result, it avoids the excessively short distance between the support column 13 and any one light-emitting device 14 to block the light exit from the light-emitting device 14, and thus avoids the uneven light exit from the light-emitting substrate 100.

In some embodiments, as shown in FIG. 1, the light-emitting substrate 100 has a plurality of light-emitting regions A. At least two light-emitting devices 14 are disposed in a light-emitting region A. A support column 13 that is close to an edge of the substrate 10 and the edge of the substrate 10 have at least two light-emitting regions A therebetween (only one light-emitting region A is shown between the support column 13 that is close to the edge of the substrate 10 and the edge of the substrate 10 in FIG. 1).

For example, as shown in FIG. 1, 8×2 light-emitting devices D are arranged in the light-emitting region A. That is, eight light-emitting devices 14 are arranged along the direction X in the light-emitting region A, and two light-emitting devices 14 are arranged along the direction Y in the light-emitting region A. Sixteen light-emitting devices 14 are totally disposed in the light-emitting region A.

For example, 4×4 light-emitting devices 14 are arranged in the light-emitting region A. That is, four light-emitting devices 14 are arranged along the direction X in the light-emitting region A, and four light-emitting devices are arranged along the direction Y in the light-emitting region A. Sixteen light-emitting devices 14 are totally disposed in the light-emitting region A.

For example, a distance between the support column 13 that is closest to the edge of the substrate 10 and the edge of the substrate 10 is less than or equal to 150 mm.

With this arrangement of the support column 13, in the case where the base 101 of the substrate 10 is the glass base, an edge region of the base 101 has a low structural strength, and is easily broken and warped under stress. Therefore, by making the orthogonal projection of the support column 13 on the base 101 to be far away from the edge region of the base 101 as far as possible, it is possible to ensure a support stability of the support column 13 to the optical film.

In some embodiments, referring to FIGS. 1 and 2A, the plurality of openings H are evenly arranged in the reflective layer 11. For example, the plurality of openings H are arranged in an array in the reflective layer 11.

In some embodiments, referring to FIGS. 1 and 2A, the plurality of support columns 13 are evenly arranged on the surface of the substrate 10. For example, the plurality of support columns 13 are arranged in an array on the surface of the substrate 10. In this way, it is easy to bond the support columns 13 on a large scale, so as to improve a bonding efficiency of the support columns 13.

In some embodiments, a distance between the two support columns 13 that are closest is less than or equal to a distance threshold, so as to ensure a support effect of the support columns 13 on the optical film.

It will be noted that the distance threshold represents an effective distance between the two support columns 13 that are closest. If the distance between the two support columns 13 that are closest is less than or equal to the distance threshold, the deformation amount of the optical film under a support of the support columns 13 meets the requirements; and if the distance between the two support columns 13 that are closest is greater than the distance threshold, the deformation amount of the optical film under the support of the support columns 13 does not meet the requirements.

For example, the distance threshold is 300 mm, and the distance between the two support columns 13 that are closest is less than or equal to 300 mm.

For example, as shown in FIG. 1, the plurality of support columns 13 are arranged in the array on the surface of the substrate 10. In this case, in a column direction (Y direction) along which the plurality of support columns 13 are arranged, a distance between two adjacent support columns 13 is less than or equal to 300 mm; and in a row direction (X direction) along which the plurality of support columns 13 are arranged, a distance between two adjacent support columns 13 is less than or equal to 300 mm.

The light-emitting substrate 100 provided in some embodiments of the present disclosure may be a Mini LED light-emitting substrate. A radial dimension of an orthogonal projection of the light-emitting device 14 of the Mini LED light-emitting substrate on the substrate 10 is in a range of 100 μm to 500 μm, such as 100 μm, 200 μm, 300 μm, 400 μm or 500 μm. The light-emitting substrate 100 may also be a Micro LED light-emitting substrate, and the radial dimension of the orthogonal projection of the light-emitting device 14 of the Micro LED light-emitting substrate on the substrate 10 is less than 100 μm. For example, the radial dimension may be 30 μm, 50 μm, 60 μm, 85 μm or 100 μm.

Figure 9:
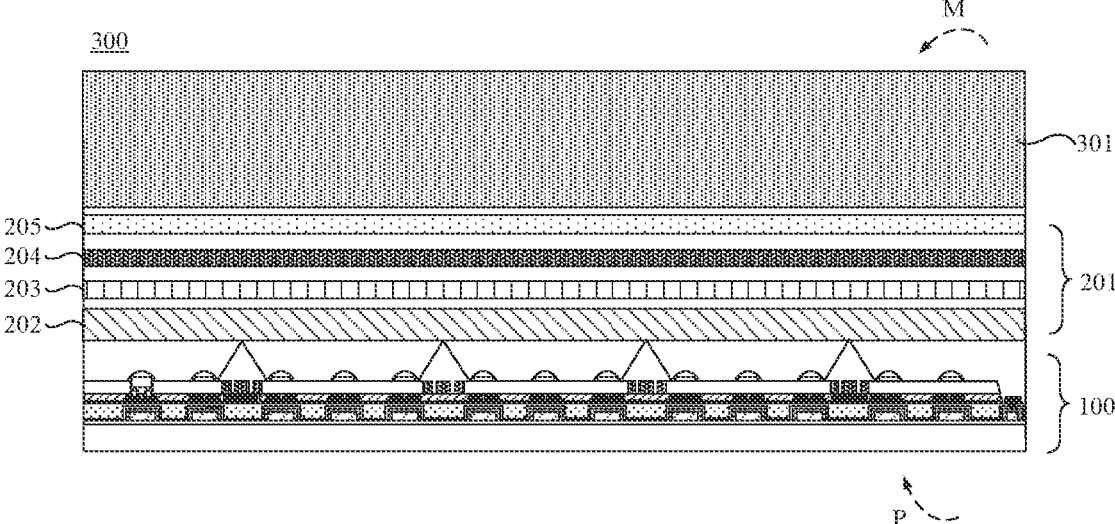
FIG. 9 is a structural diagram of a display apparatus, in accordance with some embodiments of the present disclosure.

Some embodiments of the present disclosure further provide a display apparatus. As shown in FIG. 9, the display apparatus 300 includes a display panel 301 and the light-emitting substrate 100 as described in any of the above embodiments. The light-emitting substrate 100 is disposed on a non-display side P of the display panel 301, so as to provide a backlight source for the display panel 301.

The display apparatus 300 further includes a plurality of optical films 201. The plurality of optical films 201 are disposed between the light-emitting substrate 100 and the display panel 301. That is, the plurality of optical films 201 are disposed on the light-exit side M of the light-emitting substrate 100.

For example, the plurality of optical films 201 may include a diffuser plate 202, a quantum dot film 203, a diffuser sheet 204 and a composite film 205 that are disposed in sequence along a direction away from the light-emitting substrate 100. The diffuser plate 202 and the diffuser sheet 204 are used for ameliorating the light shadow generated by the light-emitting substrate 100, thereby improving a display image quality of the display apparatus 300. Under excitation of blue light exit from the light-emitting substrate 100, the quantum dot film 203 may convert the blue light into white light, which may improve a utilization rate of light energy of the light-emitting substrate 100. The composite film 205 may be used to increase brightness of light transmitted through the composite film 205.

The display apparatus may be a liquid crystal display (LCD) apparatus.

In the display apparatus 300 in the above embodiments of the present disclosure, there is no need for the substrate 10 of the light-emitting substrate 100 to have an edge region, which is conducive to a narrow-bezel design of the display apparatus 300. In addition, since the substrate 10 has no edge region, the cost for cutting the edge region is not increased.

The display apparatus 300 may be any apparatus that displays an image whether in motion (e.g., a video) or stationary (e.g., a still image), and whether literal or graphical. More specifically, it is anticipated that the embodiments may be implemented in or associated with a variety of electronic devices. The variety of electronic devices may include, but are not limited to, mobile phones, wireless devices, personal data assistants (PDAs), hand-held or portable computers, global positioning system (GPS) receivers/ navigators, cameras, MPEG-4 Part 14 (MP4) video players, video cameras, game consoles, watches, clocks, calculators, television monitors, flat-panel displays, computer monitors, automobile displays (e.g., odometer displays), navigators, cockpit controllers and/or displays, camera view displays (e.g., rear view camera displays in vehicles), electronic photos, electronic billboards or signs, projectors, architectural structures, and packaging and aesthetic structures (e.g., displays of images of a piece of jewelry).

Figure 10:
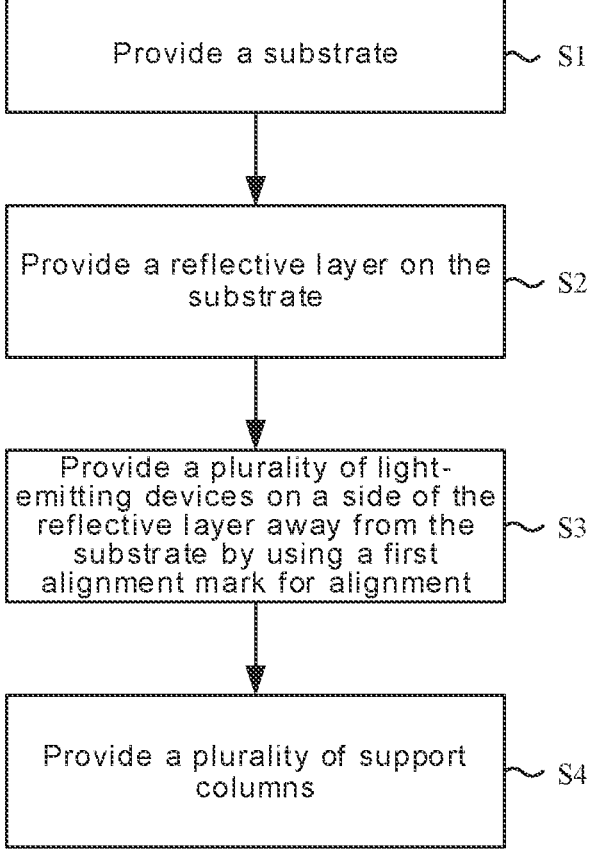
FIG. 10 is a flow chart of a method for manufacturing a light-emitting substrate, in accordance with some embodiments of the present disclosure.

Some embodiments of the present disclosure provide a method for manufacturing a light-emitting substrate, as shown in FIG. 10, the method includes S1 to S4.

In S1, a substrate is provided.

Figure 11A:
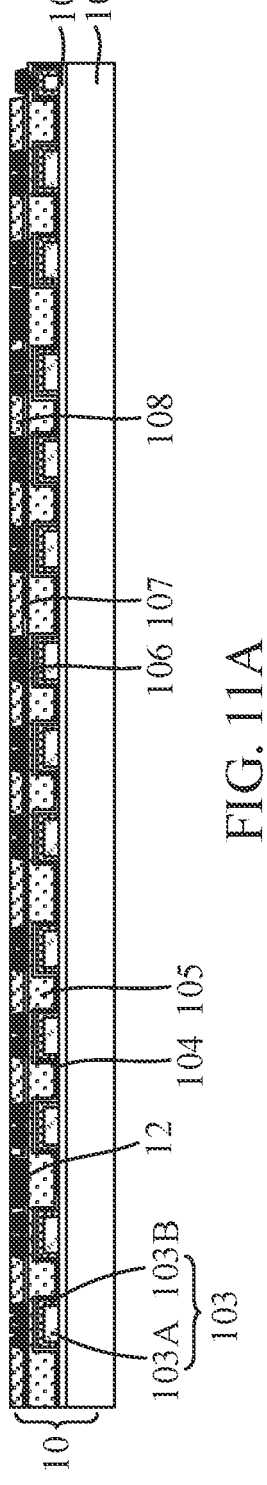
FIG. 11A is a diagram illustrating a step for manufacturing a substrate, in accordance with some embodiments of the present disclosure.

For example, as shown in FIG. 11A, the substrate 10 is provided, and the substrate 10 is provided with at least one first alignment mark 12 thereon.

It will be noted that, the substrate 10 includes a base 101 and a driving circuit disposed on the base 101. The driving circuit includes a plurality of thin film transistors and a plurality of signal lines. The first alignment mark 12 and any one conductive pattern of the driving circuit may be formed in a same process step. Alternatively, any one conductive pattern of the driving circuit is of a laminated structure, and the first alignment mark 12 is also of the same laminated structure.

For example, the substrate 10 includes the base 101, and a buffer layer 102, a first conductive layer 103, a first passivation layer 104, a first planarization layer 105, a second conductive layer 106, a second passivation layer 107 and a second planarization layer 108 that are stacked on the base 101 in sequence. The first conductive layer 103 and the second conductive layer 106 are used to form conductive patterns of the driving circuit. The first alignment mark 12 and one of the first conductive layer 103 or the second conductive layer 106 are formed in a same process step.

In S2, a reflective layer 11 is provided on the substrate 10. Through light reflection by the reflective layer 11, an amount of light exiting from the light-emitting substrate 100 along the thickness direction Z of the substrate 10 is increased, and thus the light extraction efficiency of the light-emitting substrate 100 is increased.

Figure 11B:
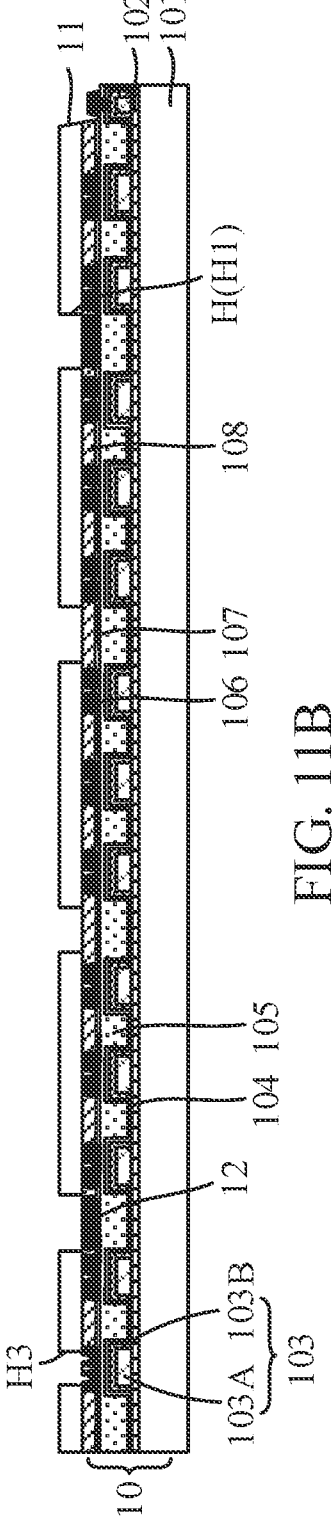
FIG. 11B is a diagram illustrating a step for manufacturing a reflective layer, in accordance with some embodiments of the present disclosure.

For example, as shown in FIG. 11B, at least part of a boundary of the reflective layer 11 coincides with at least part of a boundary of the substrate 10. The reflective layer 11 has a plurality of openings H and a plurality of installation openings H3. The plurality of openings H include at least one first opening H1, and the first opening H1 exposes a first alignment mark 12.

It will be noted that the reflective layer 11 may be a reflective sheet. In this case, the plurality of openings H in the reflective layer 11 may be fabricated in advance, and the reflective layer 11 is directly bonded to the substrate 10.

In addition, the reflective layer 11 may also be a reflective coating layer or white oil layer. The reflective layer 11 is formed by a film forming process, and the plurality of openings H are formed simultaneously. For example, a mask may be provided on the substrate 10 by using the first alignment mark 12 for alignment, and the white oil is printed on the substrate 10, so as to form the plurality of openings H in the reflective layer 11. As another example, the reflective coating layer is formed on the substrate 10 by an evaporation process, and the plurality of openings H are formed in the reflective coating layer by using an exposure development process and an etching process.

In order to ensure a dimensional accuracy of the openings H and/or the installation openings H3 in the reflective layer 11, a white glue may be sprayed along edges of the openings H and/or edges of the installation openings H3 by using a glue filling process, and a reflectivity of the white glue approaches a reflectivity of the reflective layer 11.

In S3, a plurality of light-emitting devices 14 are provided on a side of the reflective layer 11 away from the substrate 10 by using the first alignment mark 12 for alignment.

Figure 11C:
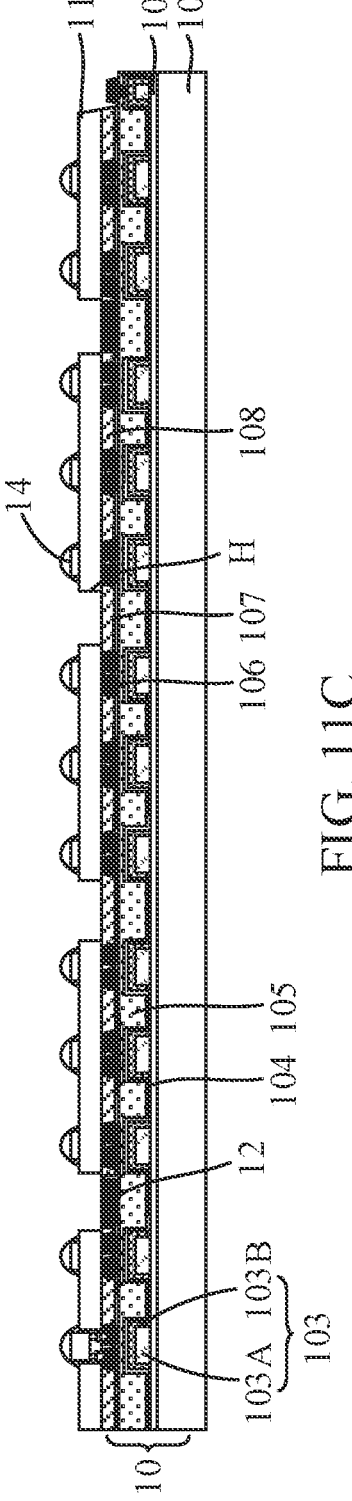
FIG. 11C is a diagram illustrating a step for manufacturing light-emitting devices, in accordance with some embodiments of the present disclosure.

For example, as shown in FIG. 11C, the first opening H1 exposes the first alignment mark 12. By acquiring a picture of the first alignment mark 12 to perform alignment, the plurality of light-emitting devices 14 are arranged on the substrate 10, and the light-emitting device 14 is located in the installation opening H3 in the reflective layer 11, so as to ensure the installation accuracy of the light-emitting device 14.

In S4, a plurality of support columns 13 are provided. The plurality of support columns 13 are used to support the plurality of optical films, so that an optical distance exists between the reflective layer 11 of the light-emitting substrate 100 and the optical films, which may ameliorate the light shadow generated by the light-emitting substrate 100 and improve the display image quality of the display apparatus.

Figure 11D:
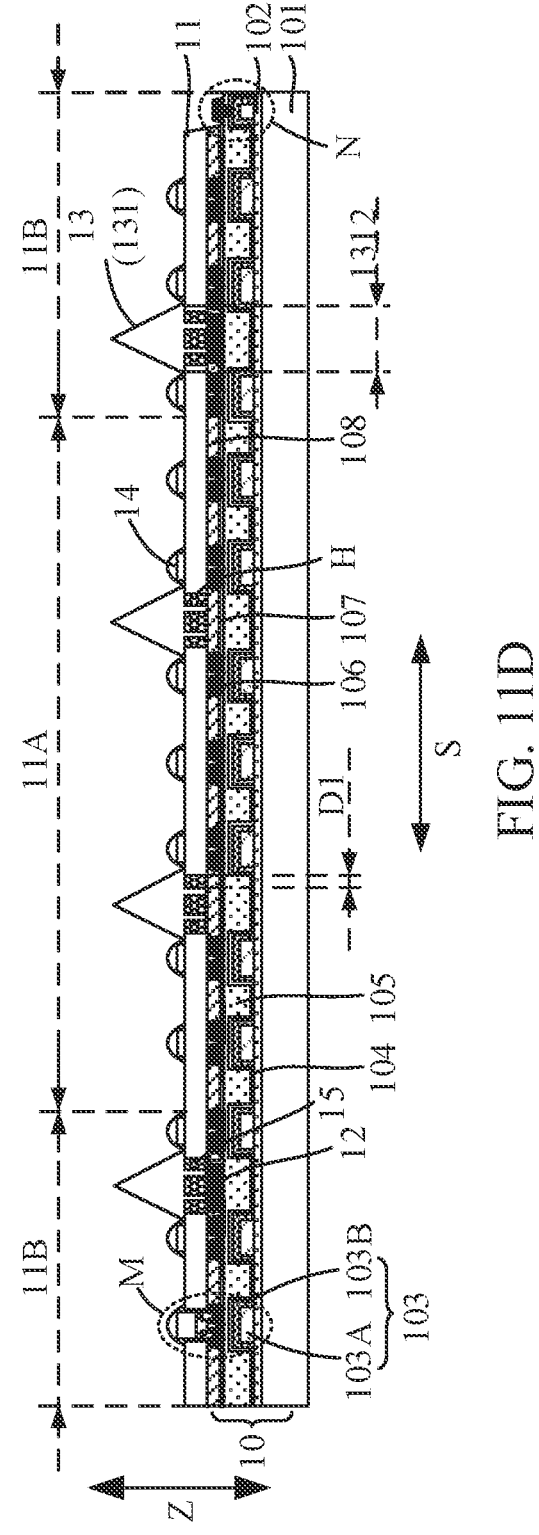
FIG. 11D is a diagram illustrating a step for manufacturing support columns, in accordance with some embodiments of the present disclosure.

For example, as shown in FIG. 11D, at least one support column 13 is disposed at the opening H, and an orthogonal projection, on the substrate 10, of the support column 13 disposed at the opening H at least partially overlaps with an orthogonal projection of the corresponding opening on the substrate 10. For example, the support column 13 may be bonded to the substrate 10 through a fixing layer 15, so as to realize the fixing of the support column 13.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A light-emitting substrate, comprising:
a substrate;
a reflective layer disposed on the substrate; the reflective layer having a plurality of openings and a plurality of installation openings, the plurality of openings including at least one first opening;
at least one first alignment mark disposed on the substrate; each first alignment mark of the at least one first alignment mark being exposed by a corresponding first opening in the at least one first opening;
a plurality of support columns; in at least one support column, an orthogonal projection of a support column on the substrate at least partially overlapping with an orthogonal projection of an opening in the plurality of openings on the substrate;
a plurality of light-emitting devices disposed on the substrate, each light-emitting device of the plurality of light-emitting devices being located in a corresponding installation opening in the reflective layer; and
fixing layers disposed on the substrate, the plurality of support columns being fixedly connected to the substrate through the fixing layers;
wherein the plurality of support columns include at least one first support column, wherein a first support column in the at least one first support column includes a pedestal disposed in the opening, and a first main body portion located on a side of the pedestal away from the substrate and connected to the pedestal;
an orthogonal projection of the first support column on the substrate covers an orthogonal projection of the opening on the substrate;
a surface of the pedestal away from the first main body portion is a first bottom surface, a surface of the pedestal connected to the first main body portion is a first top surface, and a surface of the first main body portion connected to the pedestal is a second bottom surface; an orthogonal projection of the second bottom surface on the substrate covers an orthogonal projection of the first top surface on the substrate;
an orthogonal projection of the pedestal on the substrate is in a shape of an annulus; or the pedestal includes a plurality of protrusions protruded from the second bottom surface to the substrate.

2. The light-emitting substrate according to claim 1, wherein
a dimension of the pedestal in a thickness direction of the substrate is less than or equal to a dimension of the opening in the thickness direction of the substrate.

3. The light-emitting substrate according to claim 1, wherein the first bottom surface is located in a fixing layer in the fixing layers; in the thickness direction of the substrate, the first bottom surface is located between a surface of the reflective layer proximate to the substrate and a surface of the reflective layer away from the substrate; and
the second bottom surface is in contact with the surface of the reflective layer away from the substrate, and the orthogonal projection of the second bottom surface on the substrate covers the orthogonal projection of the opening on the substrate.

4. The light-emitting substrate according to claim 1, wherein the first main body portion includes a plurality of sections in a direction parallel to a plane where the substrate is located; in the plurality of sections, an area of at least one section is greater than or equal to an area of another section located on a side of the at least one section away from the substrate; or
the first main body portion includes the plurality of sections in the direction parallel to the plane where the substrate is located;
in the plurality of sections, the area of the at least one section is greater than or equal to the area of the another section located on the side of the at least one section away from the substrate; and
in a direction directed from the pedestal to the first main body portion along the thickness direction of the substrate, areas of the plurality of sections of the first main body portion in the direction parallel to the plane where the substrate is located gradually decrease.

5. The light-emitting substrate according to claim 1, wherein a maximum distance between an outer boundary of an orthogonal projection, on the substrate, of a portion of the support column in the opening and a boundary of the orthogonal projection of the opening on the substrate is D1;
an installation tolerance of the support column is A1;
a radial dimension tolerance of the opening is A2; and
a maximum allowable movement of the support column is A3;
wherein a sum of A1 and A2 is less than or equal to D1, and D1 is less than or equal to A3 (A1+A2≤D1≤A3).

6. The light-emitting substrate according to claim 1, wherein the light-emitting substrate has a middle region and an edge region located around the middle region;
the corresponding first opening is disposed in the edge region.

7. The light-emitting substrate according to claim 6, wherein no opening exists in the middle region, the plurality of support columns further include at least one second support column disposed in the middle region; and a second support column in the at least one second support column is fixedly connected to a surface of the reflective layer away from the substrate through a fixing layer in the fixing layers; or
the plurality of openings further include at least one second opening, and no first alignment mark is exposed by a second opening in the at least one second opening; and the second opening is disposed in the middle region.

8. The light-emitting substrate according to claim 1, wherein the at least one first opening includes a plurality of first openings, and at least one of the plurality of first openings is provided with a second alignment mark therein; and
the second alignment mark and the reflective layer are made of a same material and disposed in a same layer; or the at least one first opening includes the plurality of first openings, and the at least one of the plurality of first openings is provided with the second alignment mark therein;

the second alignment mark and the reflective layer are made of the same material and disposed in the same layer; and in the plurality of first openings, a first opening provided with no second alignment mark is farther away from a center of the reflective layer than a first opening provided with the second alignment mark.

9. The light-emitting substrate according to claim 1, wherein the substrate includes a base, and a first conductive layer and/or a second conductive layer disposed on the base;

the first alignment mark is disposed in a same layer as the first conductive layer and/or the second conductive layer.

10. The light-emitting substrate according to claim 1, wherein the plurality of light-emitting devices include a plurality of light-emitting device groups, and each light-emitting device group includes at least two light-emitting devices; the at least two light-emitting devices in each light-emitting device group are evenly arranged around a corresponding support column in the plurality of support columns, and a distance between each light-emitting device in the light-emitting device group and the corresponding support column is approximately equal; or the light-emitting substrate has a plurality of light-emitting regions, and at least two light-emitting devices are disposed in a light-emitting region in the plurality of light-emitting regions; and a support column that is close to an edge of the substrate and the edge of the substrate have at least two light-emitting regions therebetween.

11. The light-emitting substrate according to claim 1, wherein a color of the fixing layers is approximately same as a color of the reflective layer.

12. The light-emitting substrate according to claim 1, further comprising:

a plurality of reflective sub-layers each including a compensation portion and a raised portion, wherein the compensation portion of at least one reflective sub-layer in the plurality of reflective sub-layers is disposed on an inner wall of the opening, and the raised portion of the at least one reflective sub-layer is disposed at an edge of the opening; and/or the compensation portion of at least one another reflective sub-layer in the plurality of reflective sub-layers is disposed on an inner wall of the corresponding installation opening, and the raised portion of the at least one another reflective sub-layer is disposed at an edge of the corresponding installation opening.

13. A display apparatus, comprising:

a display panel;

the light-emitting substrate according to claim 1, the light-emitting substrate being disposed on a non-display side of the display panel; and a plurality of optical films disposed between the light-emitting substrate and the display panel.

14. The light-emitting substrate according to claim 1, wherein the plurality of support columns further include at least one second support column, and a second support column in the at least one second support column includes a second main body portion.

15. The light-emitting substrate according to claim 14, wherein a surface of the second support column proximate to the substrate is fixedly connected to the substrate through a fixing layer in the fixing layers.

16. The light-emitting substrate according to claim 15, wherein the surface of the second support column proximate to the substrate has at least one depression, at least a portion of the fixing layer is located in a depression in the second support column; or the surface of the second support column proximate to the substrate has the at least one depression, at least the portion of the fixing layer is located in the depression in the second support column; and an orthogonal projection of the depression on the substrate is in a shape of a circle or an annulus; or the orthogonal projection of the depression on the substrate includes a plurality of sectors arranged at intervals and in an annular.

17. The light-emitting substrate according to claim 15, wherein the second support column includes a plurality of sections in a direction parallel to the plane where the substrate is located; in the plurality of sections, an area of at least one section is greater than or equal to an area of another section located on a side of the at least one section away from the substrate; or the second support column includes the plurality of sections in the direction parallel to the plane where the substrate is located;

in the plurality of sections, the area of the at least one section is greater than or equal to the area of the another section located on the side of the at least one section away from the substrate; and in a direction directed from the substrate to the second support column along a thickness direction of the substrate, areas of the plurality of sections of the second support column in the direction parallel to the plane where the substrate is located gradually decrease.

* * * * *